United States Patent
Lapushner et al.

(10) Patent No.: US 12,074,412 B2
(45) Date of Patent: *Aug. 27, 2024

(54) ELECTRICAL SERVICE ADAPTER FOR SUPPLY SIDE INTERCONNECT

(71) Applicant: Solaredge Technologies Ltd., Herzeliya (IL)

(72) Inventors: Shimshon Lapushner, Rishon LeZion (IL); Yaron Binder, Shoham (IL); Izac Assia, Shoham (IL); Jeffrey Laughy, South Lake Tahoe, CA (US); Guy Sella, Bitan Aharon (IL)

(73) Assignee: Solaredge Technologies Ltd., Herzeliya (IL)

( * ) Notice: Subject to any disclaimer, the term of this patent is extended or adjusted under 35 U.S.C. 154(b) by 88 days.

This patent is subject to a terminal disclaimer.

(21) Appl. No.: 17/991,256

(22) Filed: Nov. 21, 2022

(65) Prior Publication Data

US 2023/0080275 A1    Mar. 16, 2023

Related U.S. Application Data

(63) Continuation of application No. 16/884,765, filed on May 27, 2020, now Pat. No. 11,539,192, which is a (Continued)

(51) Int. Cl.
*H02B 1/056* (2006.01)
*G01R 11/04* (2006.01)
(Continued)

(52) U.S. Cl.
CPC .......... *H02B 1/0565* (2013.01); *G01R 11/04* (2013.01); *H01R 33/94* (2013.01); *H02B 1/03* (2013.01);
(Continued)

(58) Field of Classification Search
CPC .......... H02B 1/0565; H02B 1/03; H02B 1/04; G01R 11/04; H01R 33/94; H01R 33/945;
(Continued)

(56) References Cited

U.S. PATENT DOCUMENTS 2,606,232 A   8/1952  Willard
3,120,627 A   2/1964  Herrmann
(Continued)

FOREIGN PATENT DOCUMENTS

CN   105379049 A   3/2016
EP   0865061 B1    6/2005
(Continued)

OTHER PUBLICATIONS

Oct. 24, 2018—EP Search Report App No. 18193115.5.
(Continued)

*Primary Examiner* — Zachary Pape
(74) *Attorney, Agent, or Firm* — Banner & Witcoff, Ltd.

(57) ABSTRACT

An assembly or adapter configured to provide a supply-side interconnect of electrical power to a distribution board. The adapter may be incorporated internal or external to the distribution board, by occupying the space of one or more circuit breakers, inserting an adapter into a meter termination socket, or the like. The adapter includes terminals provided to route the conductors from the utility to a breakout panel (or subpanel) for adding power devices as a supply side interconnect, and back to a regular route that may go through the meter and/or the main circuit breaker, and on to the loads. A switching component may provide an inline configuration that configures the conductors for backup function, and a parallel configuration that is a parallel interconnecting route when utility service is available.

20 Claims, 14 Drawing Sheets

Related U.S. Application Data continuation of application No. 16/122,979, filed on Sep. 6, 2018, now Pat. No. 10,700,498.

(60) Provisional application No. 62/555,724, filed on Sep. 8, 2017.

(51) Int. Cl.
| | |
|---|---|
| *H01R 33/94* | (2006.01) |
| *H01R 33/945* | (2006.01) |
| *H02B 1/03* | (2006.01) |
| *H02J 3/00* | (2006.01) |
| *H02J 7/00* | (2006.01) |
| *H02J 9/06* | (2006.01) |

(52) U.S. Cl.
CPC .......... *H02J 3/0073* (2020.01); *H02J 7/0042* (2013.01); *H02J 9/06* (2013.01); *H01R 33/945* (2013.01)

(58) Field of Classification Search
CPC .......... H02J 3/006; H02J 3/382; H02J 7/0042; H02J 3/0073; H02J 9/06
USPC .................................................. 361/627–658
See application file for complete search history.

(56) References Cited

U.S. PATENT DOCUMENTS

| | | | |
|---|---|---|---|
| 3,644,870 | A | 2/1972 | Jones |
| 4,977,482 | A | 12/1990 | Langdon et al. |
| 5,439,396 | A | 8/1995 | Magdaleno |
| 5,539,168 | A | 7/1996 | Linzenich |
| 5,898,387 | A | 4/1999 | Davis et al. |
| 6,074,246 | A | 6/2000 | Seefeldt et al. |
| 6,188,145 | B1 | 2/2001 | Stewart |
| 6,200,158 | B1 | 3/2001 | Robinson |
| 6,255,927 | B1 | 7/2001 | Fischer et al. |
| 6,420,801 | B1 | 7/2002 | Seefeldt |
| 6,791,211 | B1 | 9/2004 | Flegel |
| 7,030,514 | B2 | 4/2006 | Wareham et al. |
| 7,040,920 | B2 | 5/2006 | Johnson et al. |
| 7,648,389 | B1 | 1/2010 | Scott et al. |
| 7,813,110 | B1 | 10/2010 | Rezac |
| 7,855,871 | B2 | 12/2010 | Hudgins, Jr. et al. |
| 7,957,121 | B1 | 6/2011 | Nichols |
| 7,994,934 | B2 | 8/2011 | Kagan |
| 8,177,580 | B2 | 2/2012 | Trimberger |
| 8,235,747 | B2 | 8/2012 | Fish |
| 8,368,386 | B2 | 2/2013 | Reineccius |
| 8,514,551 | B2 | 8/2013 | Cosley et al. |
| 8,721,363 | B2 | 5/2014 | Garwood et al. |
| 8,784,130 | B2 | 7/2014 | Scott et al. |
| 9,318,861 | B2 | 4/2016 | Fulton et al. |
| 9,437,986 | B2 | 9/2016 | Knauer et al. |
| 9,500,672 | B1 | 11/2016 | Bautista et al. |
| 9,552,949 | B2 | 1/2017 | Fischer |
| 9,595,815 | B2 | 3/2017 | Knauer et al. |
| 9,728,972 | B2 | 8/2017 | Cruz |
| 9,735,527 | B2 | 8/2017 | Bautista et al. |
| 9,772,347 | B2 | 9/2017 | Parks et al. |
| 9,904,308 | B2 | 2/2018 | Parks et al. |
| 9,995,768 | B2 | 6/2018 | Parks et al. |
| 10,089,641 | B2 | 10/2018 | Parks et al. |
| 10,132,838 | B2 | 11/2018 | Parks et al. |
| 10,211,610 | B2 | 2/2019 | Atchley et al. |
| 10,260,903 | B2 | 4/2019 | Kagan |
| 10,431,986 | B2 | 10/2019 | Fulton et al. |
| 10,460,329 | B2 | 10/2019 | Parks et al. |
| 10,475,053 | B2 | 11/2019 | Parks et al. |
| 10,482,481 | B2 | 11/2019 | Parks et al. |
| 10,580,016 | B2 | 3/2020 | Parks et al. |
| 10,636,043 | B2 | 4/2020 | Parks et al. |
| 10,700,498 | B2 | 6/2020 | Lapushner et al. |
| 10,830,802 | B2 | 11/2020 | Fulton et al. |
| 2002/0171436 | A1 | 11/2002 | Russell |
| 2003/0034693 | A1 | 2/2003 | Wareham et al. |
| 2010/0003848 | A1 | 1/2010 | Scott et al. |
| 2010/0218798 | A1 | 9/2010 | Cinnamon et al. |
| 2014/0127935 | A1 | 5/2014 | Scott et al. |
| 2016/0056617 | A1 | 2/2016 | Cruz |
| 2016/0141846 | A1 | 5/2016 | Atchley et al. |
| 2016/0211611 | A1 | 7/2016 | Cruz |

FOREIGN PATENT DOCUMENTS

| | | |
|---|---|---|
| WO | 2009141246 A1 | 11/2009 |
| WO | 2017/011339 A1 | 1/2017 |

OTHER PUBLICATIONS

Feb. 15, 2023—Chinese Office Action—CN App. No. 201811013203.9.

Rossetti, Gabrielle, "Installers: Put the Solar Breaker on the Opposite Side of the Main Breaker—Here's Why," Heatspring Magazine, Sep. 28, 2016.

Casalegno, Marco, "PV Interconnection: Load-Side vs. Line-Side," Greentech Renewables, Aug. 2015.

Pacific Gas and Electric Company, "Requirements for Line Side Interconnections for Distributed Generation," May 15, 2017.

Business Wire, "World's First Solar and Renewable Energy Bus Bar Bypass Breaker the B3 From Qfactory33 Receives UL Certicifcations," Jun. 1, 2017.

Apr. 11, 2024—Chinese Office Action—CN App. No. 201811013203.9.

ELECTRICAL SERVICE ADAPTER FOR SUPPLY SIDE INTERCONNECT

RELATED APPLICATIONS

This application is a continuation of U.S. application Ser. No. 16/884,765, filed May 27, 2020, which is a continuation of U.S. application Ser. No. 16/122,979, filed Sep. 6, 2018 (now U.S. Pat. No. 10,700,498), which claims priority to U.S. Provisional Application No. 62/555,724, filed Sep. 8, 2017, the entire contents of each application are incorporated herein by reference.

BACKGROUND

The disclosure relates to the field of electrical distribution boards.

Electricity may be generated at power plants and may move through a complex system, sometimes called the grid or utility supply, of electricity substations, transformers, and power lines that connect electricity supply and load devices. Local grids may be interconnected for reliability and economic purposes, and the local grids may form larger networks that enhance the coordination and planning of electricity supply. The origin of the electricity that consumers purchase may vary. Some electric utilities may generate all the electricity they sell by using just the power plants the utilities own. Some utilities may purchase electricity directly from other utilities, power marketers, independent power producers, a wholesale market organized by a regional transmission reliability organization, and/or the like. Consumers may utilize their own photovoltaic (PV, such as PV solar panels) units and a direct current (PC) to alternating current (AC) converter (also known in the art as an inverter) may be used to sell their electricity to a utility company, use the electricity of the supplier, supply their own electricity for certain periods of time, store their own produced electricity for later use, supply their own electricity when the local utility grid has a power outage, and/or the like.

Sustainable power generation systems may increasingly be used in commercial and residential buildings both to augment the electrical grid supply, as backup power sources, and/or the like. Sustainable power generation systems may include electrical generation systems based on solar power, wind turbines, geothermal power, biofuel power, hydroelectric power, and/or the like. Similarly, backup generators may be used to provide power during grid failure periods.

The background is not intended to limit the disclosed aspects of features, and not intended as limiting the application to a particular field or problem

SUMMARY

The following summary is a short summary of some of the inventive concepts for illustrative purposes only, and is not intended to limit or constrain the inventions and examples in the detailed description. One skilled in the art will recognize other novel combinations and features from the detailed description.

According to at least one aspect, there is provided an assembly that includes at least one utility-side electrical connector configured to be connected to a power meter. The assembly also includes at least one load-side electrical connector configured to be connected to a load-side conductor of the distribution panel. The assembly further includes at least one first mechanical lug electrically connected to the at least one utility-side electrical connector. The assembly still further includes at least one second mechanical lug electrically connected to the load-side conductor, in which the at least one first mechanical lug and at least one second mechanical lug are electrically isolated.

According to at least one aspect, there is provided a method that includes mechanically connecting an assembly to an electrical distribution panel substantially at a location of a main circuit breaker, in which the assembly includes, for each pole of the main circuit breaker: at least one utility-side electrical connector configured to be connected to a power meter conductor, at least one load-side electrical connector configured to be connected to a load-side conductor of the electrical distribution panel, at least one first mechanical lug electrically connected to the at least one utility-side electrical connector, and at least one second mechanical lug electrically connected to the load-side conductor, wherein the at least one mechanical lug and at least one second mechanical lug are electrically isolated. The method also includes electrically connecting the at least one utility-side electrical connector to the power meter. The method further includes electrically connecting the at least one load-side electrical connector to a busbar of the electrical distribution panel. The method still further includes electrically connecting at least one of the at least one first mechanical lug and the at least one second mechanical lug to an alternative electrical energy source.

As noted above, this Summary is merely a summary of some of the features described herein. It is not exhaustive, and it is not to be a limitation on the claims.

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures.

DETAILED DESCRIPTION

Figure 1:
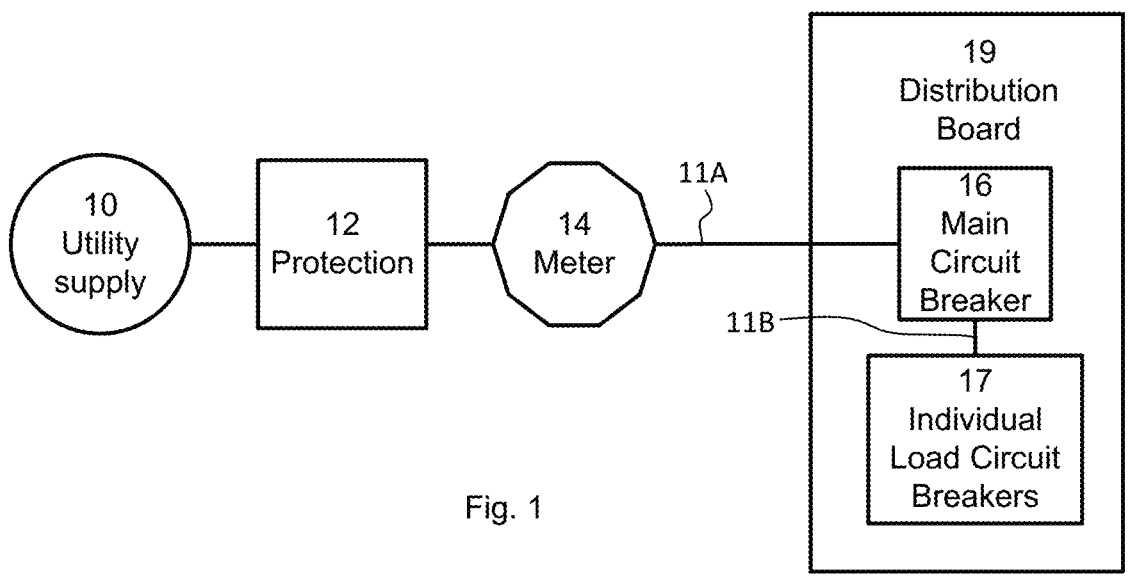
FIG. 1 illustrates a block diagram of a utility supply connected to a distribution board, according to illustrative aspects of the disclosure.

Disclosed herein are aspects of adapters, devices, methods, and systems for interconnecting a power generation system (PGS) to a building's electrical system. For example, an adapter may provide terminals, such as mechanical lug terminals and/or the like, within/on/near the distribution board, where the adapter is placed in a location usually occupied by a component of the distribution board, such as a passive component, an electrical meter, a main circuit breaker, a circuit breaker, and/or the like. At least some of the adapter device, or possible all of the adapter, may extend beyond the planned location of the component. For example, an adapter and some of the elements of the adapter may extend into the cavity of the distribution board. For example, a meter adapter may be located between the meter socket and the meter, and may extend beyond the location originally occupied by the meter to accommodate the terminals and conduits needed. For example, a main circuit breaker adapter may extend into the cavity of the distribution board so that the main circuit breaker can be located at the planned location, and the terminal lugs for a supply side interconnect may be located within the distribution board cavity.

The adapter connects to the conductors of the original component, such as an input and output terminal for each pole of the component, but unlike the original component that may provide an electrical connection between the input and the output terminals, the adapter does not electrically connect between the input and the output terminals. The adapter instead provides the additional mechanical lug terminals that may be used to feed in electrical power from a PGS, relocate the original component to a subpanel, and/or the like. For example, the subpanel may further provide electrical components for feeding energy from an on-site PGS to the grid. For example, the subpanel may further provide electrical components for switching between a grid supply connection to the loads, and a PGS supply to the loads, such as when a power outage occurs.

The functions of the original component may be preserved by the adapter. For example, the adapter may replace a main circuit breaker for interconnecting the PGS, and the adapter may incorporate at least some functions of the main circuit breaker, such as ground fault protection, overcurrent protection, arc fault protection, and/or the like. For example, a meter adapter may comprise a socket for installation of the utility kilowatt hour (kWh) meter over the adapter front face. For example, a meter adapter may comprise a kWh meter for measurement of the grid feed-in energy.

The adapter may incorporate some or all of the functions of the subpanel, such as incorporating switches for configuring the PGS for grid feed-in, configuring the PGS for backup load, and/or the like. For example, the adapter incorporates a circuit breaker for the PGS feed-in to the grid. For example, the adapter incorporates one or more sensors for computing the performance of the PGS.

The adapter may be incorporated into an adapter kit, such as by providing components that are configured to connect to the distribution board at the location of an original component. The adapter kit may provide double-ended (or double-sided) mechanical lug terminals to bypass the original component, such as double ended terminals that connect on one side to the distribution board's busbar, cable, wire, and/or the like, and terminals on the other end to accept cables from a subpanel, a power converter, a solar inverter, and/or the like. The mechanical lugs may be electrically isolated. The adapter kit may provide a front plate cover assembly, that is configured to cover a hole in the dead-front (such as a cover for protecting an operator from "hot" conductors and the like) of the distribution board when the original component is not present.

For example, the adapter kit front plate is a set of two plates and screw assemblies between the two plates. When the screw assemblies are rotated in a clockwise direction, the plates are pulled together. By positioning one of the two plates on one side of the dead-front above the hole, the other plate on the other side, and closing the screws, the plates are pressed against the dead front from both sides to secure the plates over the hole thereby eliminating the hole from the dead front. The adapter kit may provide a housing configured to enclose one or more double-sided mechanical lugs providing further isolation from other components within the distribution panel. The housing may connect and/or position the front plate assemble to prevent movement of the front plate assembly, assist in joining the front plate assembly, and/or the like.

For example, an adapter kit comprises double-sided terminals and a front plate assembly configured for each specific make/model of distribution board, or one or more kits may cover multiple types of distribution board with at least some common features. For example, an adapter kit comprises two or more sets of double-sided terminals (each set configured for at least one specific make/model of a distribution board) and two or more front plate assemblies (each assembly configured for at least one specific make/model of a distribution board). For example, an adapter kit comprises two or more different sizes of front plate assemblies for different sized holes in the dead front. For example, the adapter kit comprises two or more different sizes and shapes of housings configured for different makes and models of distribution boards. The benefits of the adapter kit may include reducing the time for installation of a secondary electrical service (PGS), including a backup electrical generator, a solar power generation system, a wind turbine power generation system, and/or the like.

For example, the adapter kit may mitigate the need to replace the distribution board. For example, the adapter kit may mitigate the need for a representative of the utility company form making two visits to assist in assembling a supply side interconnect. The electrical contractor, in this example, may install the PGS, and prepare all cabling required for the supply side interconnect, and a representative of the utility company may arrive to the installation, pull the electrical meter, and inspect the PGS system and wiring. The electrical contractor, in this example, may assemble the adapter kit in the distribution board and connect the cables to the PGS. The utility company representative may then inspect the wiring and/or the like, and reinstall the meter. This example may illustrate reduction in the time that the utility company representative and the electrical contractor need to complete the supply-side interconnection, as the utility company representative may visit the installation site once, instead of multiple times.

The following examples describe aspects of an adapter incorporated into a location reserved for a main breaker, a location of a utility power meter, including a meter adapter/extender located between the original meter and the meter socket, and/or the like. Other locations of an existing distribution board that may be used for one or more adapters are load circuit breakers, interface cavities, distribution board cavities, interfaces between a meter and a service disconnect box, and/or the like.

The description below is with reference to drawings that depict electrical circuits, were single-line electrical connections may be used instead of dual- or triple-line conductors to reduce visual noise and increase clarity of the figures. Each single-line electrical connection indicated in the drawings may in practice be implemented using two or more conductors. For example, with regard to FIG. 5, PV unit 22 may be connected to converter 24*a* via two conductors—one connecting the positive output of PV unit 22 to the positive input of converter 24*a*, and one connecting the negative output of PV unit 22 to the negative input of converter 24*a*.

These and other features, aspects, and advantages of the present disclosure will become better understood with regard to the following description, claims, and drawings. The present disclosure is illustrated by way of example, and not limited by, the accompanying figures.

In the following description of various illustrative embodiments, reference is made to the accompanying drawings, which form a part hereof, and in which is shown, by way of illustration, various embodiments in which aspects of the disclosure may be practiced. It is to be understood that other embodiments may be utilized and structural and functional modifications may be made, without departing from the scope of the present disclosure.

The term "multiple" as used here in the detailed description indicates the property of having or involving several parts, elements, or members. The claim term "a plurality of" as used herein in the claims section finds support in the description with use of the term "multiple" and/or other plural forms. Other plural forms may include for example regular nouns that form their plurals by adding either the letter 's' or 'es' so that the plural of "converter" is "converters" or the plural of "switch" is "switches" for example.

Prior to describing various aspects of the invention, a brief description of power generations systems that can an electrical service adaptor as described below is provided hereinbelow.

Sustainable power generation systems are increasingly being used in commercial and residential buildings both to augment the electrical grid supply, as backup power sources, and/or the like. Sustainable power generation systems may include electrical generation systems based on solar power, wind turbines, geothermal power, biofuel power, hydro-electric power, and/or the like. Similarly, backup generators may be used to provide power during grid failure periods.

Electrical power generation systems, including photovoltaic (PV) systems, may be electrically connected to building loads and feed excess electrical power to the electrical grid, through a circuit breaker/distribution board, a combination service entrance device (CSED), a main breaker box, a load center, an all-in-one electrical distribution board, and/or the like. As used herein, the terms circuit breaker/distribution panel/board, combination service entrance device (CSED), main breaker box, distribution board, meter box, circuit box, electrical box, load center, and/or the like, may be used interchangeably, and mean one or more building electrical supply boxes comprising electrical supply components, including utility/supply/load conductors (e.g., wires or busbars), one or more utility side protection units, one or more power/energy meters, one or more main circuit protection breakers, load side circuit breakers, and/or the like. The building electrical supply components may be located in one or more enclosures or boxes, where some of the boxes may be adjacent. For example, a single all-in-one electrical panel box may be partitioned into a meter enclosure, a main circuit breaker enclosure, a load circuit breakers enclosure, and/or the like.

The main circuit breaker provides a switch for main electrical shutoff, short-circuit protection, overcurrent protection, arc-fault protection, ground-fault protection, and/or the like. Electrical regulations, such as the National Electrical Code (NEC) regulations, provide rules for connecting the electrical panel to the grid and household loads, as well as technical constraints for the main circuit breaker, and/or the like. The main breaker may be directly or indirectly connected to bus bars within the panel box, where the circuit breakers for the household loads may be connected, and the main breaker may be electrically connected to the electrical grid, and may be electrically connected to an electrical meter maintained by the electrical supply service company. For example, the meter, main breaker, and individual load circuit breakers may be located in a CSED located at a residence, building, office, and/or the like.

Distribution panels, such as CSEDs, may be provided in many shapes, sizes, electrical configurations, and/or the like. Some CSEDs may combine the utility company electrical meter, a main circuit breaker, load circuit breakers, alternative energy input terminals, and/or the like. In some CSEDs, the utility meter is adjacent to the main circuit breaker. In some CSEDs, the utility meter, main circuit breaker, and the load circuit breakers may be adjacent to each other, or may be abutting each other. The main circuit breaker within each CSED is specially matched to the configuration of that specific CSED. For example, the main circuit breaker has one or more external mechanical lugs for connecting wires from a utility meter to the main circuit breaker, including external mechanical lugs for accepting a 2/0 AWG wire, a 3/0 AWG wire, and/or the like. For example, the main circuit breaker has one or more flanges with bolt holes to connect the main breaker to one or more respective busbars. The wire gauge may be expressed in circular mils, such as Kcmil, MCM, and or the like. For example, a 3/0 AWG wire is 168 Kcmil, 168 MCM, and/or the like.

For example, the main circuit breaker may be manufactured by Eaton® and comprises external mechanical lugs for connecting an aluminum or copper #12-2/0 American wire gauge (AWG) feeder wire, an aluminum or copper #4-300 AWG feeder wire, and/or the like. For example, the main circuit breaker is manufactured by Square D and is compliant with a model QOM1 configuration type, a model QOM2 configuration type, and/or the like. For example, the main circuit breaker comprises external mechanical lugs (for meter wires, busbar wires, and/or the like), bolt holes (for connecting busbars, meter conductors, and/or the like), and/or the like.

For alternative energy harvested at a residence and supplied to the loads/grid, a load-side or supply-side interconnect may be used, where each interconnect type may be associated with further regulations defining the rules for attachment of the alternative energy source. For example, a solar energy system may be connected at the load-side of the main circuit breaker and the circuit breaker for the solar energy system may be located in the endmost circuit breaker position on the busbars, and may be located farthest from the main breaker. For example, a solar energy system may be connected at the supply-side of the main circuit breaker and the circuit breaker for the solar energy system is located in a sub-panel located between the utility meter and the main circuit breaker.

Depending on the maximum power rating of the PV system, the PV system may be electrically connected to the supply-side or the load-side of the main breaker. For example, a high power PV system may be electrically connected with a supply-side interconnection. For example, a low power (e.g., less than 20% of the maximum rated load of the main circuit breaker) PV system may be electrically connected with a load-side interconnection. The electrical regulations within each geographic region may determine the power threshold for load-side or supply-side interconnection. For example, some districts require a PV system to be limited to 20% of the total rated panel power, and connected at the opposing end of the busbars from the main circuit breaker.

For example, a 100-amp load center with the 20-amp load side interconnect PV breaker may allow a PV system with an inverter output rated current of 16 amps. The circuit breaker protecting the inverter output circuit may be at least 125% of the rated inverter output current or in other terms, the rated inverter current may be no larger than 80% of the breaker rating (according to NEC 690.8). At 240 volts, this may allow a maximum inverter rating of 3840 watts (240× 16). Similarly, a 200-amp load center with no change in the main breaker, may handle only up to an inverter rated at 7680 watts.

Reference is now made to FIG. 1, which illustrates block diagram of how a utility supply 10 may be connected to a distribution board 19, according to illustrative aspects of the disclosure. Utility supply 10 may be a single phase alternating current (AC) supply, a three phase AC supply and/or a split phase supply of voltages L1 and L2 that are provided at secondary terminals of a transformer, for example. The split phase may come from the secondary of the transformer where a center tap of the secondary provides a neutral. Utility supply 10 may, for example, have a RMS voltage of 220 volts across the respective ends of the transformer (L1 and L2) and two RMS voltages of 110 volts between L1 and the neutral and L2 and the neutral.

Protection unit 12 may include fuses, circuit breakers, neutral link, earth/ground terminals (e.g., to terminate the conductors of a cable), conductors (conveyed in a conduit, trunking, bus bars, gland, and/or the like, from utility supply 10 to protection unit 12 and from protection unit 12 to meter 14), and/or the like. For example, protection unit 12 may be located in the supply side of an enclosure, which may be certified by a utility company. The output of protection unit 12 may connect to the input of meter 14 again with the use of cables, conduits and/or bus bars 11A. Similarly, the output of meter 14 may connect to the input of main circuit breaker 16 and distribution board 19 via cables, conduits, bus bars 11B and the like. Distribution board 19 may include a main circuit breaker 16, load circuit breakers 17, and/or terminals for the termination of loads, including lighting circuits or power outlet circuits in a property.

Figure 2:
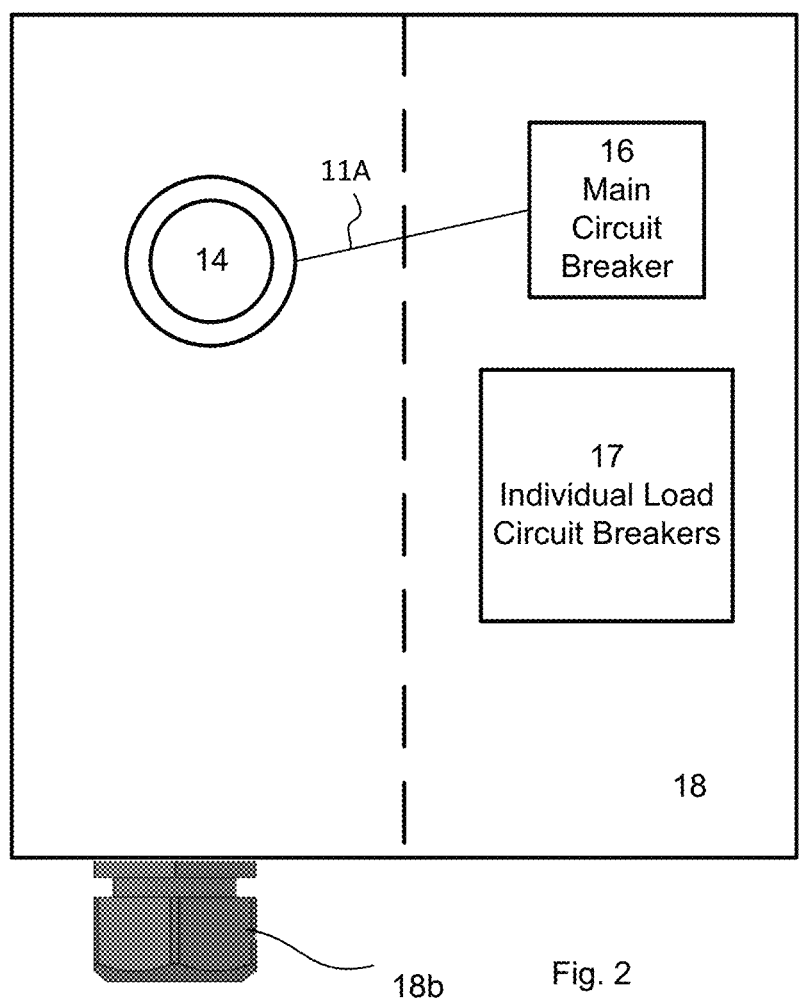
FIG. 2 shows schematically a distribution board housing, according to illustrative aspects of the disclosure.

Reference is now made to FIG. 2, which shows a plan view of a housing 18, according to illustrative aspects of the disclosure. Housing 18 includes a gland 18b that may be used to secure and attach a cable (not shown) to housing 18. The cable may include conductors that may be terminated in protection unit 12 (not shown) that may be located inside housing 18 to the left of an isolation barrier shown by the dotted line in FIG. 2. Meter 14 is shown mounted into a socket termination (not shown) that may be mounted in housing 18. The socket termination may provide female sockets that provide both an input connection to meter 14 and may connect to an output of meter 14. Meter 14 may include corresponding male plugs to enable meter 14 to be plugged into the socket termination thereby mounting meter 14 to housing 18 and allowing the electrical connection between protection unit 12 and the input of meter 14 as well as the connection between the output of meter 14 and the input to distribution board 19. The connections between the output of meter 14 and the input to distribution board 19 and between protection unit 12 and the input of meter 14 may be by cables, conductors conveyed in a conduit/trunking and/or bus bars 11B. In the above description, protection unit 12, the socket termination for meter 14 and distribution board 19 are shown housed in housing 18, but may be separately housed and/or mounted at some distance from each other in alternative implementations. The conductors from meter 14 may be connected to a service disconnect, including main circuit breaker 16, and/or the like, through busbars leading to meter 14 socket, and from meter 14 socket to main circuit breaker 16. Some conductors may be large-gauge wire, cables, busbars, and/or the like. Electrical connections may use a conduit, a trunking, a cable, a gland (e.g., cable connectors), and/or the like, to secure and attach cables to housings, for example.

Figure 3:
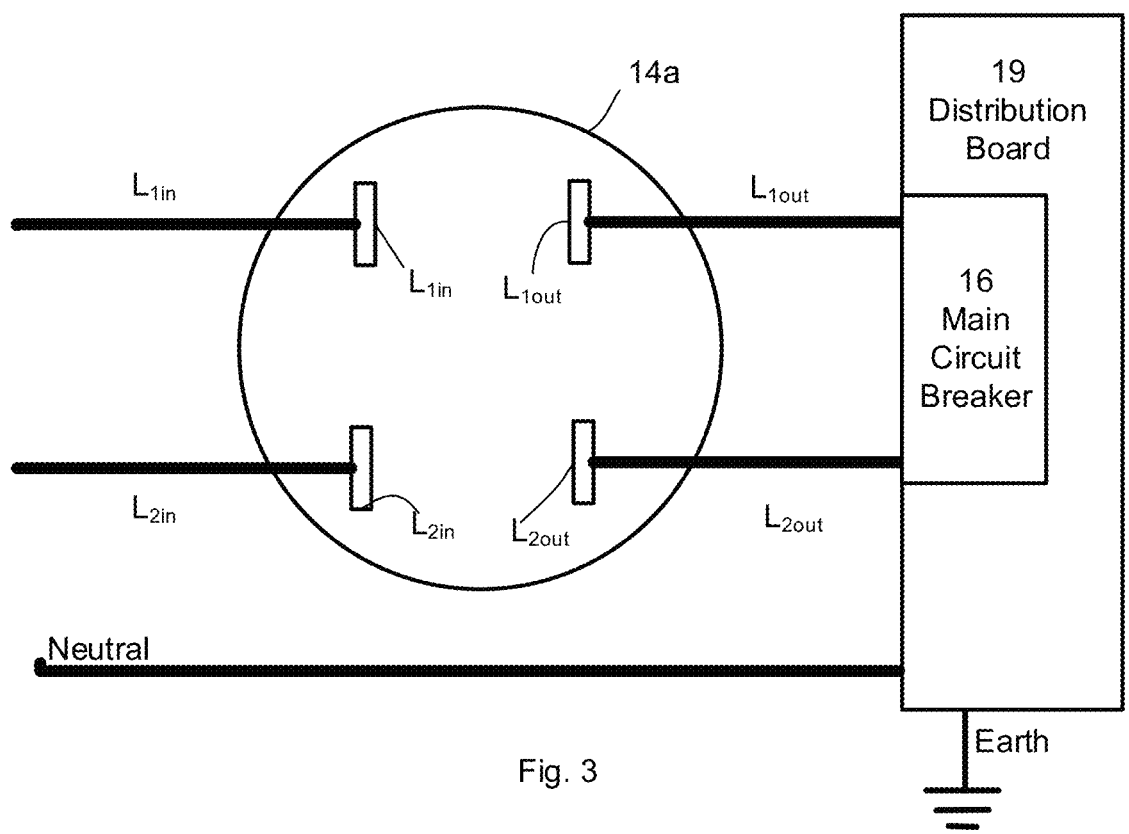
FIG. 3 shows schematically the electrical connections of a socket termination, according to illustrative aspects of the disclosure.

Reference is now made to FIG. 3, which shows the electrical connections of socket termination 14a, according to illustrative aspects of the disclosure. Conductors labeled as $L_{1in}$ and $L_{2in}$ may be terminated at terminals $L_{1in}$ and $L_{2in}$. Similarly, conductors labeled as $L_{1out}$ and $L_{2out}$ may be terminated at terminals $L_{1out}$ and $L_{2out}$. Conductors $L_{1in}$ and $L_{2in}$ may be conveyed from protection unit 12 via bus bars, cables or by trunking and may be terminated at $L_{1in}$ and $L_{2in}$ of socket termination 14a. Similarly, conductors $L_{1out}$ and $L_{2out}$ may be conveyed from terminals $L_{1out}$ and $L_{2out}$ of socket termination 14a via bus bars, cables or by trunking, and may be terminated at terminals located in distribution board 19, for example, terminals of main circuit breaker 16. The neutral and the ground lines are terminated in distribution board 19. The ground may be derived from a ground rod driven into the ground in proximity to housing 18 and terminated in distribution board 19 for example. Between the connections between utility supply 10, protection unit 12 and meter 14, connection and terminals may be provided to allow neutral and ground conductors to be connected to each other in order to fulfill ground bonding requirements, for example, and continuity of electrical ground, for example.

Figure 4:
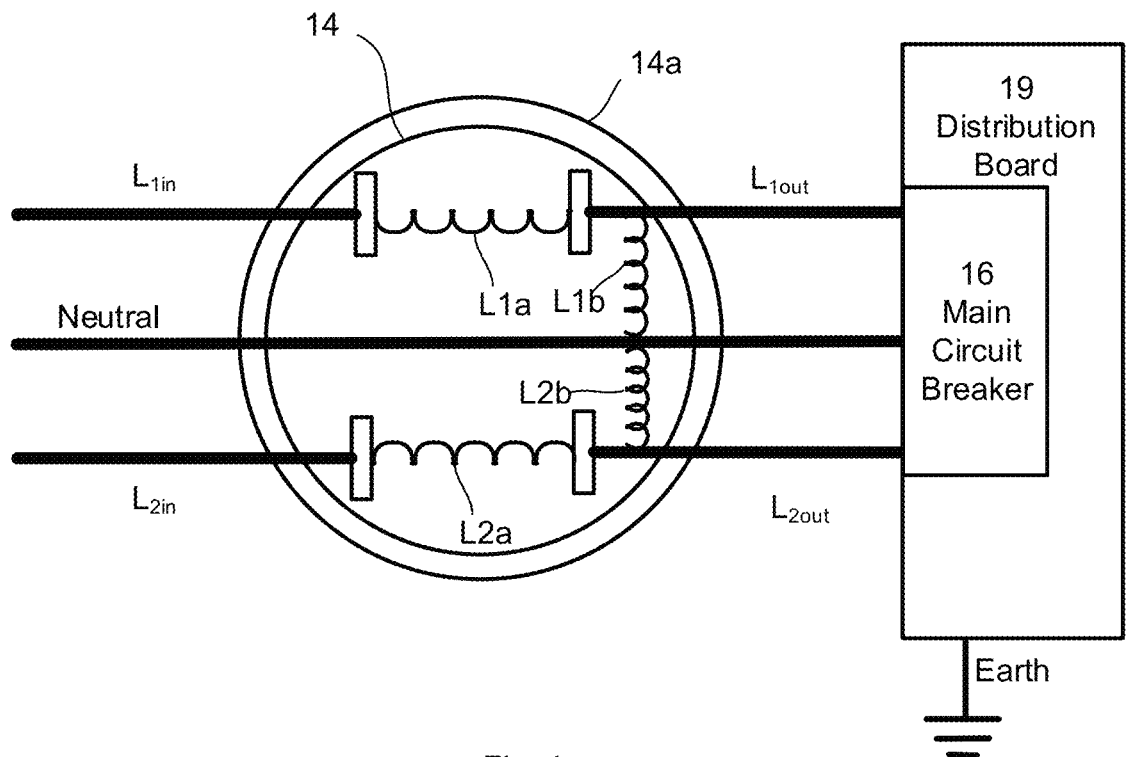
FIG. 4 shows schematically a socket termination with a meter inserted into the socket termination, according to illustrative aspects of the disclosure.

Reference is now made to FIG. 4, which shows socket termination 14*a* with meter 14 inserted into socket termination 14*a*, according to illustrative aspects of the disclosure. The insertion of meter 14 into socket termination 14*a* may enable corresponding male plugs of meter 14 to be mated with the female socket terminations of terminals $L_{1in}$, $L_{2in}$, $L_{1out}$ and $L_{2out}$ of socket termination 14*a*. As such, the unplugging of meter 14 from socket termination 14*a* isolates utility supply 10/protection unit 12 from distribution board 19. Further illustrative details of some of the parts of meter 14, for an electro-mechanical version of meter 14, or alternatively a solid-state meter 14, may be plugged into socket termination 14*a*. Further illustrative details of some of the parts of meter 14 are shown as sensors/coils L1*a* and L1*b* that may sense respective current through and/or voltage at conductors $L_{1in}$, and $L_{1out}$ as a result of the load demand from loads terminated in distribution board 19. Similarly, sensors/coils L2*a* and L2*b* may sense respective current and voltage through conductors $L_{2in}$ and $L_{2out}$. As such, the current and voltage through sensors/coils L1*a*/L2*a* and L1*b*/L2*b* drive the electro-mechanical mechanism of meter 14 to give the number of kW·h consumed by the loads terminated in distribution board 19.

Figure 5:
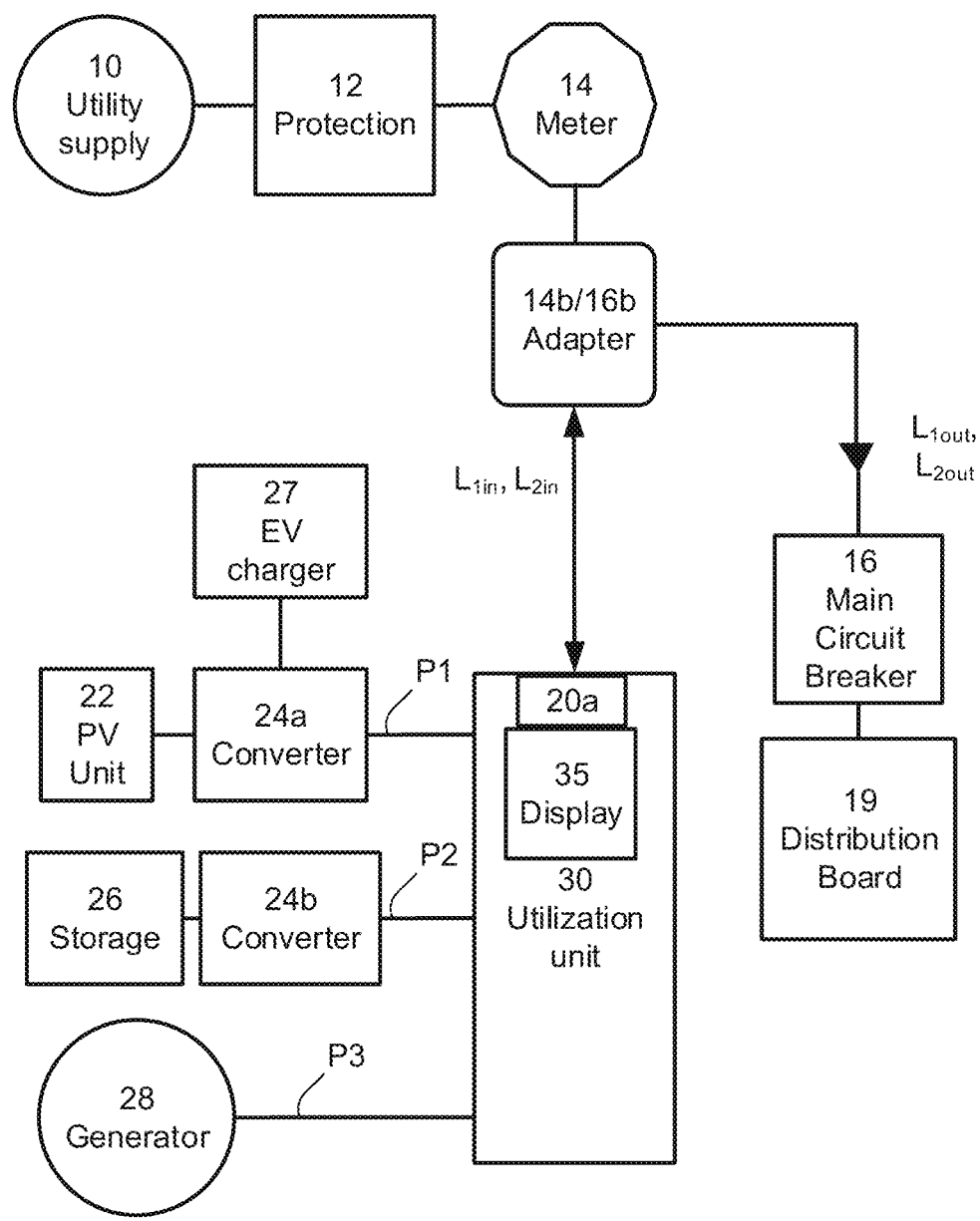
FIG. 5 shows schematically a block diagram of an adapter that may be applied to a utility supply connected to a distribution board as shown in FIG. 1, according to illustrative aspects of the disclosure.

Reference is now made to FIG. 5, which shows an adapter that may be applied to utility supply 10 connected to a main circuit breaker 16 and/or distribution board 19 as shown in FIG. 1, according to illustrative aspects of the disclosure. As mentioned previously, utility supply 10 made be a single-phase supply, a split phase and/or a three-phase supply of alternating current (AC) electrical power. Descriptions that follow, by way of example, include providing a split phase of two live conductors and a neutral. A meter adapter 14*b* may be inserted into socket termination 14*a* and meter 14 inserted into socket termination 14*a*. Alternatively, a circuit breaker adapter 16*b* may be inserted into the location of a main circuit breaker. As such, utility supply 10 and protection unit 12 may be isolated/disconnected from main circuit breaker 16 as a result of adapter 14*b*/15*b*. Additionally, meter 14 may measure power supplied to utility supply 10 and/or main circuit breaker 16 from photovoltaic unit 22/converter 24*a*, storage device 26/converter 24*b* and/or generator 28, as well as measuring power drawn from utility supply 10 storage device 26. As a result of the insertion of adapter 14*b* inserted into socket termination 14*a* and insertion of meter 14 into adapter 14*b*, or alternatively the use of circuit breaker adapter 16*b*, the output from utility supply 10 may connect the output of utility supply 10/protection unit 12 into the input and/or output of utilization unit 30.

As used herein, the term utilization unit 30 refers to a set of electrical components, possibly enclosed in a housing, which assist in utilization of an alternative electrical power source and/or service, where the set may include such components as switches, inverters, micro-inverters, circuit breakers, feed-in sensors, meters, controllers, and/or the like. The utilization unit 30 or parts thereof may be incorporated and/or distributed into other elements, including adapter 14*b*/16*b*, a subpanel, a cavity of housing 18, and/or the like. For example, a utilization unit 30 is located in a subpanel. Components of utilization unit 30 may be configured for AC power supplies, and in some cases DC power supplies as well, at least for some components. This disclosure may describe these conductors as AC power conductors, but it may be understood that the conductors may also be configured as DC power conductors, for example, a low-voltage DC power conductor may comprise a higher current rating than AC power conductors, and vice versa. For example, a 600-volt DC power may be converted to a 220-volt AC power, and the current of the AC power conductors may have a current rating 3 times higher than the DC power conductors.

When adapter 14*b* is inserted into socket termination 14*a* but meter 14 is not inserted into adapter 14*b*, the utility supply 10 and protection unit 12 may supply voltage on conductors $L_{1in}$, $L_{2in}$ into the input/output (I/O) port 20*a* of utilization unit 30, but not reach conductors $L_{1out}/L_{2out}$. In this case, utilization unit 30, which may be located in a subpanel, may provide power form an alternate source through conductors P1, P2, and/or P3 in order to supply power to the loads connected to main circuit breaker 16 by conductors $L_{1out}/L_{2out}$ according to the descriptions that follow.

Power to the loads connected to distribution board 19 may be supplied by power from utility supply 10 and/or power conductors P1, P2 and P3. Power conductor P1 may be provided as a result of the direct current (DC) power of photovoltaic unit 22 being converted to AC power by converter 24 that may be a DC to AC inverter. A portion of the DC power of photovoltaic unit 22 may also be provided to electric vehicle (EV) charger circuit 27. Alternatively or additionally, converter 24*a* working in conjunction with utilization unit 30, may further include the feature of converting AC power from utility supply 10, AC power conductor P2 and/or AC power conductor P3 to provide the DC power required by electric vehicle (EV) charger circuit 27.

Similarly, AC power conductor P2 may be provided by the conversion of DC power from storage device(s) 26 (e.g., batteries, super capacitors, flywheels) to AC by use of converter 24*b* utilized as a DC to AC inverter. Alternatively or additionally, converter 24*b* connected to storage device(s) 26 working in conjunction with utilization unit 30, may further include the feature of converting AC power from utility supply 10, AC power conductor P1 and/or AC power conductor P3 to provide the DC power required by electric vehicle (EV) charger circuit 27 and/or the DC power required to charge/recharge storage device 26.

AC power conductor P3 may be supplied from an AC generator 28 that may be, for example, a wind turbine driven by the wind and/or fuel based generator. AC power conductor P3 may be provided in the absence of power from utility supply 10 and/or AC power conductor P1 if, for example, it is night time so that photovoltaic unit 22 is unable to generate DC power. In sum, AC power conductors P1, P2, and/or P3 may supply the power demand of loads connected to distribution board 19 and/or additionally provide power onto utility supply 10 or re-charge storage device 26, for example.

Figure 6:
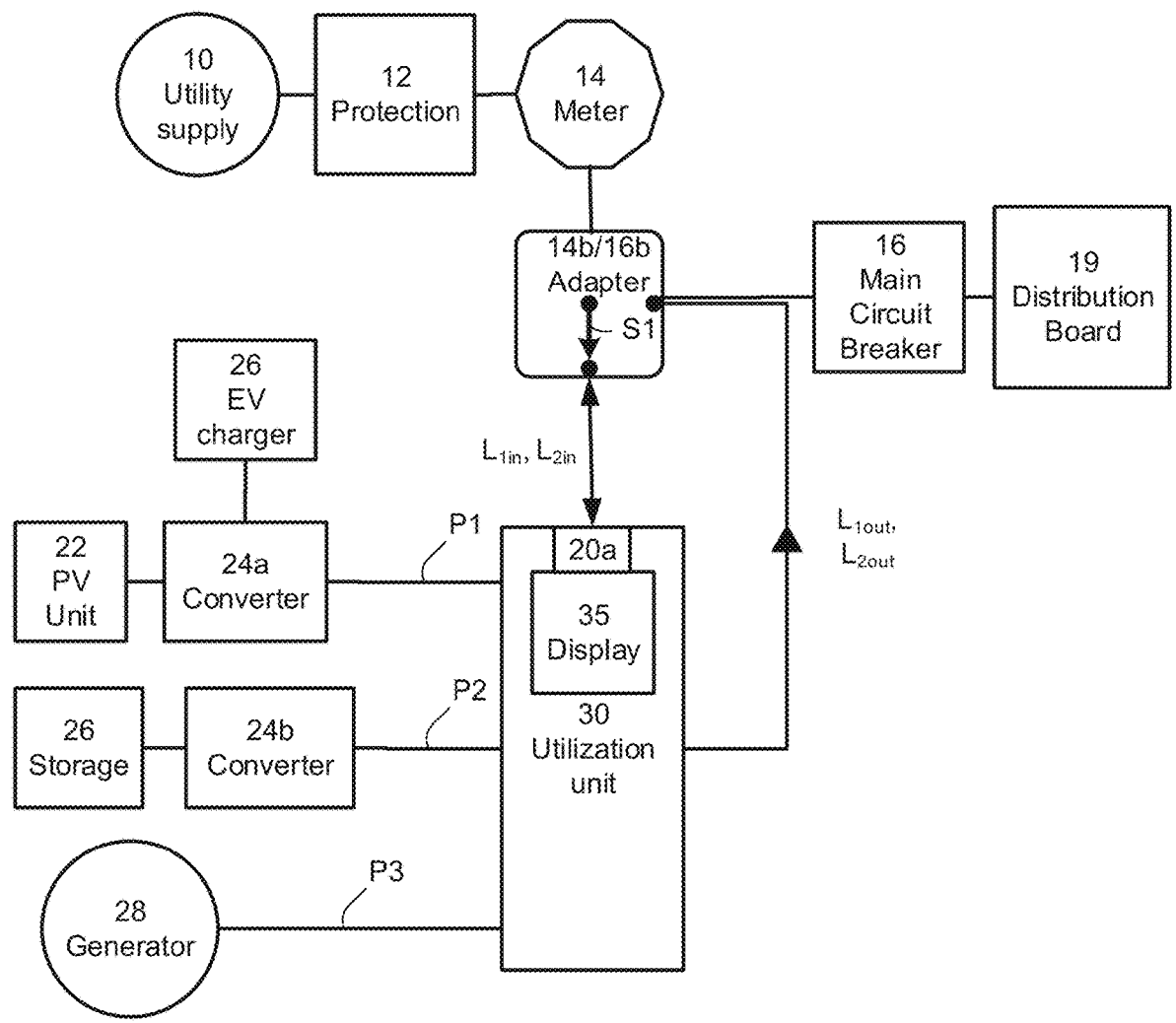
FIG. 6 shows schematically a block diagram an adapter that may be applied to a utility supply connected to a distribution board as shown in FIG. 1, according to illustrative aspects of the disclosure.

Reference is now made to FIG. 6, which shows an adapter that may be applied to utility supply 10 connected to a distribution board 19 as shown in FIG. 1, according to illustrative aspects of the disclosure. FIG. 6 is the similar to FIG. 5 with a switch S1 provided in adapter 14*b* or 16*b*. Switch S1 may be a manual switch that may, while in a first state, allow a user to supply AC power to distribution board 19 directly as shown in FIG. 1 (with utilization unit 30 optionally connected to distribution board 19 as depicted to provide power from PV unit 22 and/or storage device 26 to distribution board 19), or, while in a second state, via utilization unit 30 that forms a system similar to the description above with respect to FIG. 5. A third switch position for switch S1 in conjunction with other switches disposed in utilization unit 30 may also be provided (not explicitly shown), which isolates both utility supply 10 and the output of utilization unit 30 ($L_{1out}$, $L_{2out}$) from distribution board 19. Switch S1 may be manually switched from the first state to the second state to provide a path via utilization unit 30 for the power provided by utility supply 10. Utilization unit 30 may then provide switching, monitoring and/or safety functionality as disclosed with regard to FIG. 9.

Current ratings of electrical connections C1, C2, C3 and C4 may be in accordance with the maximum current anticipated to flow through the electrical connections. For example, when distribution board 19 is rated to receive up to 200 A (200 amperes), electrical connections C1, C2, C3 and C4 may be rated to conduct up to 200 A. The electrical connections between utilization unit 30 and converters 24a and/or 24b may be rated to carry a reduced current provided by converters 24a and/or 24b, for example, up to 50 A.

Figure 7:
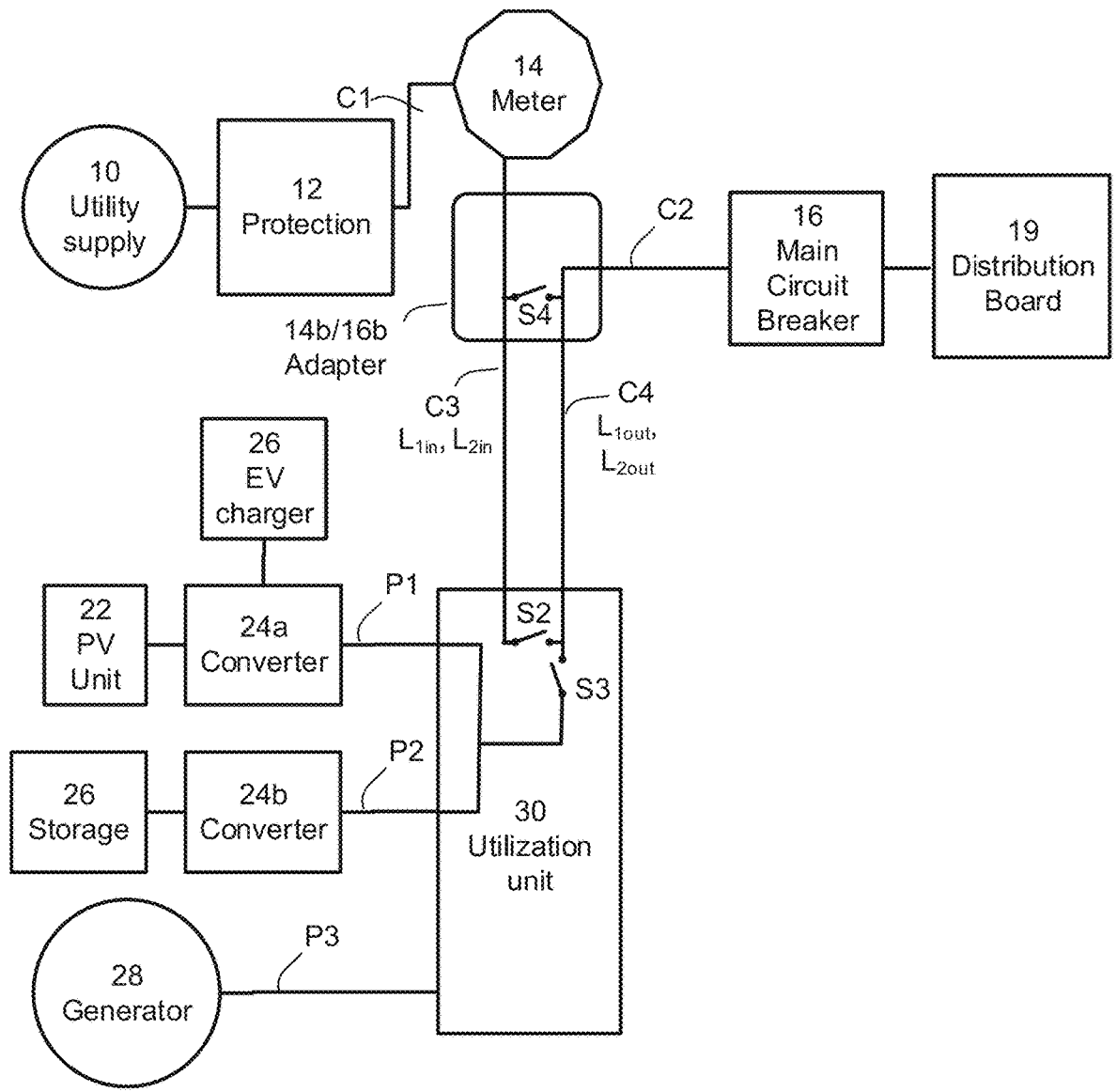
FIG. 7 shows schematically a block diagram of an electrical system, according to illustrative aspects of the disclosure.

Reference is now made to FIG. 7, which shows a block diagram of an electrical system according to illustrative aspects of the disclosure. Adapter 14b/16b may provide a first electrical connection C1 to protection unit 12 and/or directly to utility supply 10 on a first end, and may provide a second electrical connection C2 to main circuit breaker 16 and/or distribution board 19 on a second end. Adapter 14b/16b may further be designed to receive meter 14 as described in the disclosure herein. Adapter 14b/16b may further have a third electrical connection C3 to utilization unit 30 and a fourth electrical connection C4 to utilization unit 30. Electrical connection C1 may internally (inside adapter 14b/16b) be connected to electrical connection C3, and electrical connection C2 may internally be connected to electrical connection C4.

Utilization unit 30 (shown without optional display 35) may include switch S2 disposed between electrical connections C3 and C4, and switch S3 between electrical connection C4 and an electrical connection to converter 24a and/or converter 24b. During a first mode of operation, switches S2 and S3 may both be ON, allowing providing power from utility supply 10 and from PV unit 22 and/or storage device 26 to distribution board 19. In a second mode of operation (e.g., due to a grid outage, sensed by one or more sensors included in utilization unit 30, for example sensors/sensor interfaces 33 of FIG. 9, or due to a temporarily high cost of power drawn from utility supply 10 reported, for example, via communication device 32), switch S2 may be OFF and switch S3 may be ON, allowing providing backup power from PV unit 22 and/or storage device 26 to distribution board 19. In a third mode of operation (e.g., during lack of production and/or malfunction in converter 24a and/or converter 24b), switch S2 may be ON and switch S3 may be OFF, allowing providing power from utility supply 10 to distribution board 19 without loading the circuit with non-generating or non-functioning elements. In a fourth mode of operation (e.g., due to routine maintenance, fire and/or a different unsafe condition at distribution board 19), both switches S2 and S3 may be OFF, disconnecting main circuit breaker 16 from all power sources.

According to some features of the disclosure herein, an additional switch S4 may be disposed inside adapter 14b/16b, between electrical connections C3 and C4. Switch S4 may be optionally provided to enable manually connecting and disconnecting of electrical connection C3 and electrical connection C4. A manual switch may be particularly useful where adapter 14b/16b is readily accessible to a system user (e.g., where adapter 14b/16b is installed in a readily accessible electric box) and where utilization unit 30 might not be readily available Electrical connections C3 and C4 may each comprise one or more conductors (e.g., electrical cables). Electrical connections C3 and C4 may be disposed side by side in a conduit connected between adapter 14b/16b and utilization unit 30.

Figure 8:
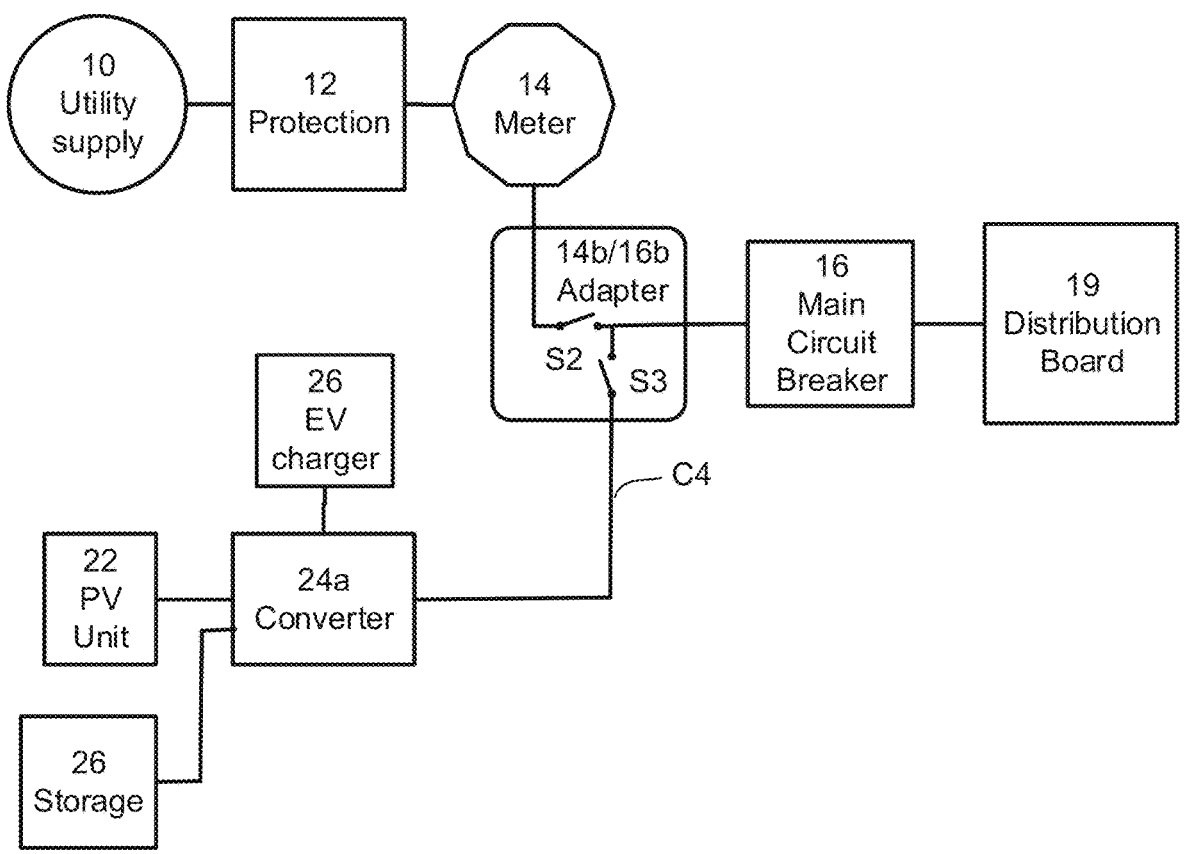
FIG. 8 shows schematically a block diagram of an electrical system, according to illustrative aspects of the disclosure

Reference is now made to FIG. 8, which shows a block diagram of an electrical system according to illustrative aspects of the disclosure. In the system of FIG. 8, switches S2 and S3 (and additional associated circuitry not explicitly depicted, including sensor(s)/sensor interface(s) 33, one or more controllers 31 and/or one or more communication devices 32 of FIG. 9) are integrated into adapter 14b/16b. This implementation may provide a benefit of not requiring a separate utilization unit 30. An additional advantage may include electrical connection C4 connecting adapter 14b/16b to converter 24a being rated to conduct a reduced current. For example, when converter 24a may output a maximum current of about 40 A (40 amperes) and the full current available to main circuit breaker 16 may be about 200 A, electrical connection C4 (e.g., a conduit having two or more conductors, the conductors potentially of a substantial length, for example, where converter 24a is on the roof of a house and distribution board 19 is on a low floor of the house) may be rated at the reduced current rate of 40 A, potentially providing substantial cost savings. Additionally, FIG. 8 illustrates PV unit 22 and storage device 26 sharing a common converter 24a, which may provide a single connection interface to adapter 14b/16b.

Figure 9:
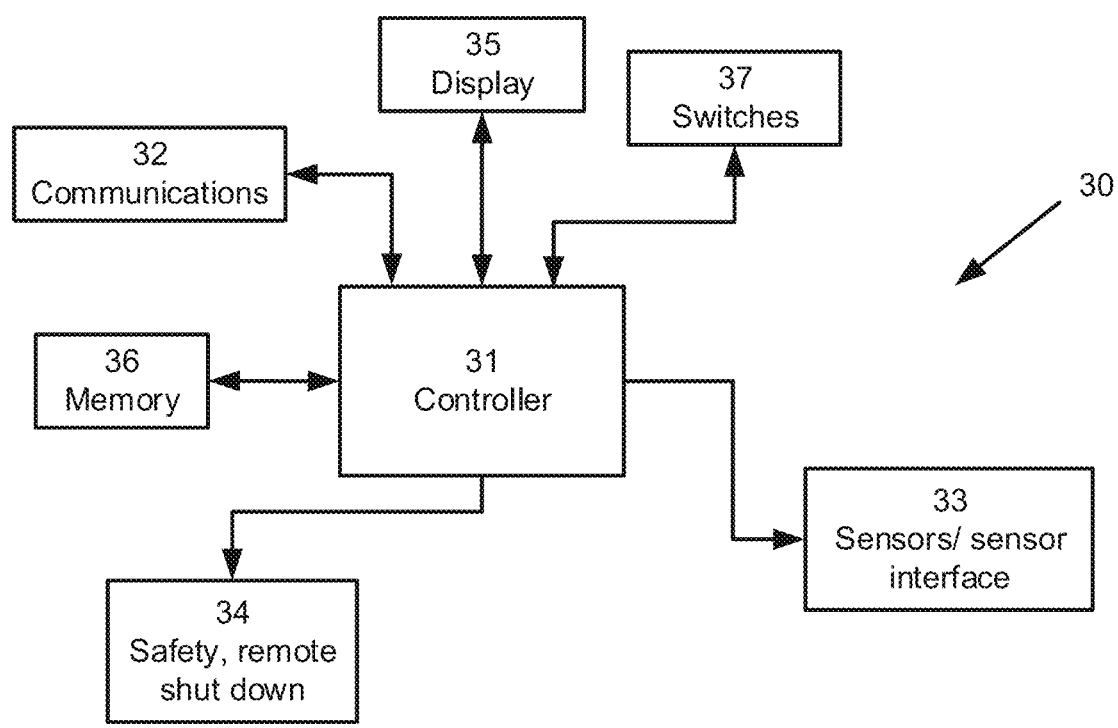
FIG. 9 shows schematically a block diagram of further details of a utilization unit, according to illustrative aspects of the disclosure.

Reference is now made to FIG. 9, which shows a block diagram of further details of utilization unit 30, according to illustrative aspects of the disclosure. A controller 31 (e.g., including a microprocessor, microcontroller and/or digital signal processor (DSP), or including an analog control device) may connect to a memory device 36. Controller 31 may serve as a central controller to other controllers that may be included in converters 24a/24b, DC to DC converters that may be included in photovoltaic units 22, EV charger circuit 27 and/or storage device 26. Communications interface 32 connected to controller 31 may provide communications between controller 31 and other controllers/communication interfaces included in converters 24a/24b, photovoltaic units 22, EV charger circuit 27 and/or storage device 26. The communications, based on a control algorithm running on controller 31, may include control signals and measured or sensed parameters sensors/sensor interface included in converters 24a/24b, photovoltaic units 22, EV charger circuit 27, and/or storage device 26 similar to sensor sensor/sensor interface 33. The communication may be conveyed by use of wireless (e.g., Wi-Fi, Bluetooth™ ZigBee™ etc.) or wired (e.g., power line communications (PLC), a RS232/485 communication bus, acoustic communication) and/or near field communications, for example. Communications interface 32 may communicate with a local area network or cellular network in order to establish an internet connection that may provide a feature of remote monitoring or reconfiguration of utilization unit 30, converters 24a/24b, photovoltaic units 22, EV charger circuit 27, storage device 26, and/or the like.

Switches 37 and activation thereof by controller 31 may enable power to be provided to distribution board 19 from utility supply 10 and/or power conductors P1, P2 or P3. Display 35 connected to central controller 31 may be mounted on the surface of the housing of utilization unit 30, or when utilization unit 30 is included in adapter 14b/16b, may be mounted on the surface of the housing of adapter 14b/16b. Display 35 may display, for example, the power delivered from conductors P1, P2 and/or P3 measured by sensors/sensor interface(s) 33 as well how power delivered from conductors P1, P2 and/or P3 are currently being utilized compared to power supplied from utility supply 10. The comparison may additionally be realized by a user by virtue of display 35 being in proximity to power usage displayed by meter 14. Power usage displayed by meter 14 may include indication of power supplied to utilization unit 30 and/or power received from utilization unit 30.

Connected to controller 31 is safety and remote shutdown unit 34. Sensing by sensors/sensor interface 33 as well as sensed parameters communicated to controller 31 from sensors/sensor interfaces of converters 24a/24b, photovoltaic units 22, EV charger circuit 27 and/or storage device 26 may be indicative of a fault condition or that a case of islanding (e.g., due to a grid outage) may be taking place. Islanding may be the condition in which a distributed generator (DG) that generates power from power conductors P1, P2 and P3 continues to power a location even though utility supply 10 is no longer present. Islanding may be dangerous to utility workers, who may not realize that a circuit is still powered, and under an islanding condition, a system controller may cause disconnection of devices and/or may prevent automatic re-connection of devices. As such, safety and remote shutdown unit 34 may operate switches 37 and switch S1 to avoid islanding and/or to isolate a fault condition.

Described hereinbelow are aspects of a circuit breaker adapter, which may correspond to a main circuit breaker adapter.

A circuit breaker adapter may be used to place mechanical screw lugs for electrical wires in the space normally occupied by the circuit breaker, which may correspond to the main circuit breaker. The dedicated adapter device may convert each electrical connection of the main breaker of the distribution board to two or more internal mechanical lug terminals. For example, the adapter is used to electrically connect the wires from the electrical meter to a PV system, place the main circuit breaker at an alternative location within/outside the distribution board, connect the relocated main breaker to one or more busbars (including electrical connectors and/or the like) in the distribution board, and/or the like. The internal mechanical lugs may be placed inside the adapter's housing (such as in the space occupied by the main circuit break), and an access port provided for entry and exit of electrical conductors (that may be current and voltage rated according to the main breaker), including I/O AWG conductors, 2/0 AWG conductors, 3/0 AWG conductors, 4/0 AWG conductors, or the like. For example, the wire gauge is determined by a current rating of one or more component of the distribution board, including the main breaker current rating, the busbar current rating, the utility power meter current rating, and/or the like.

For example, the adapter device may be configured to mechanically substitute the main breaker, including external/internal connectors for the electrical wires/conductors from the meter and to the breaker busbars. The adapter converts the space normally occupied by the main breaker to internal mechanical lug connectors that may be used to relocate the main breaker, and incorporate an interconnection for an alternative power system. For example, a backup generator may be connected to a distribution board by replacing the main breaker with the adapter, relocating the main breaker to a backup generator power board, including a subpanel, comprising the breakers and interconnections to electrically incorporate the backup generator to the load breakers, and connecting wires from the backup power board to the load busbars for the load center (load breakers).

The adapter may connect between an electrical distribution board and a renewable alternative energy source, such as a solar power system (such as comprising PV units), a wind turbine power generator, a micro-power plant (such as an electrical power plant powered by gas, fuel, coal, building exhaust heat, hydro, hydrothermal, and/or the like), and/or the like. For illustrative purposes, a solar (PV) system is used as an example. For example, an adapter is used to connect to a utilization unit that interfaces to the inverter of a PV power generation system.

The adapter device may comprise one or more circuit breakers, one or more sensors, one or more switches, one or more relay, one or more electrical meters, one or more inverters (including a micro-inverter), one or more shunt trip devices, one or more audible alarms, one or more under-voltage trip device, one or more arc-fault protection device, one or more ground-fault protection device, and/or the like.

The adapter may comprise a cover for the distribution board faceplate, such that the hole or opening left in the distribution board faceplate left when a main breaker is not present. For example, the adapter cover ensures the faceplate has an electrically dead front as required by the United States National Electrical Code (NEC), or National Fire Protection Association (NFPA) 70—a regionally adoptable standard for the safe installation of electrical wiring and equipment in the United States.

The adapter may comprise a body that incorporates two or more mechanical lugs in addition to any mechanical and/or electrical connectors of the main circuit breaker. For example, the body may be mechanically connected to the cover, and allows connecting the wires from the meter to the PV system, from the PV system to the main circuit breaker, and from the main circuit breaker to the load center circuit breakers.

The adapter may comprise a base that allows attaching the body to the mechanical connector of distribution board where the main circuit breaker normally connects. For example, the base comprises a mechanical latch the grasps one or more tabs that secure the main breaker to the distribution board.

The adapter may comprise modular parts, and may comprise a cover, a body, a base, and/or the like. For example, an adapter product comprises a large number of covers and bases to fit a large number of distribution boards, and several bodies (and may include fewer than the number of covers/bases), each for a different embodiment of board wiring. In this example, the body, base, cover, and/or the like, may be selected based on the distribution board installed at for a building, and the modular components combined to produce the adapter needed for the installed distribution board.

Figure 10:
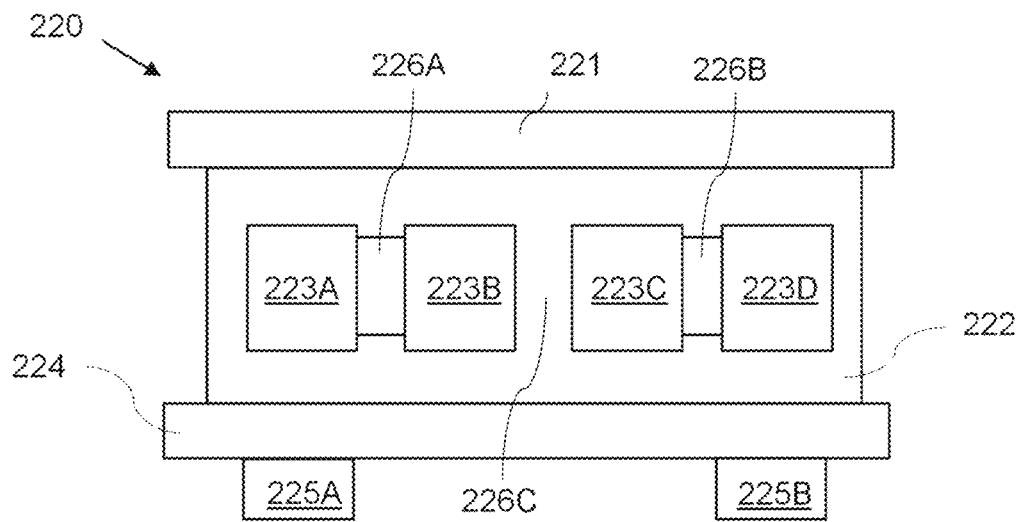
FIG. 10 shows schematically a first embodiment of an adapter for converting a main circuit breaker to internal mechanical lugs, according to illustrative aspects of the disclosure.

Reference is now made to FIG. 10, which shows schematically a general embodiment of an adapter 220 for converting a main circuit breaker location to internal mechanical lugs. Adapter 220 may comprise a cover 221, a body 222, and a base 224. Cover 221 is mechanically configured to substantially fill a hole in a front covering of a distribution board so as to provide a dead-front to the distribution board when the main circuit breaker is not present. Cover 221 may be modular and mechanically configured to connect to body 222. Body 222 may comprise electrical connectors 223A, 223B, 223C, 223D, and the like, for connecting electrical conductors, including wires, busbars, and/or the like.

For example, electrical connector 223A may be configured to connect to a power meter. For example, electrical connector 223A may be electrically connected with a conductor 226A to electrical connector 223B. Electrical connectors 223B and 223C may be configured to electrically connect to a PV system, including electrical connection by using electrical wires, a conductor, a busbar, and/or the like. Electrical connector 223B and electrical connector 223C may be electrically isolated, including isolation by way an isolator 226C. Electrical connectors 223C and 223D may be electrically connected, with such an electrical connection may by a conductor 226B. At least some of electrical connectors 223A, 223B, 223C, and 223D may be comprised within cover 221 on a side of the cover opposite to the dead front of the distribution board. At least some of electrical connectors 223A, 223B, 223C, and 223D may be comprised within base 224.

Base 224 may be modular and/or mechanically connected to body 222. Base may comprise one or more mechanical connectors, including connectors 225A, 225B, and/or the like to connect adapter 220 to distribution board, for connecting adapter to a distribution board frame, one or more distribution board busbars, and/or the like. At least one or more of cover 221, body 222, and base 224 may be modular and connected mechanically.

Figure 11:
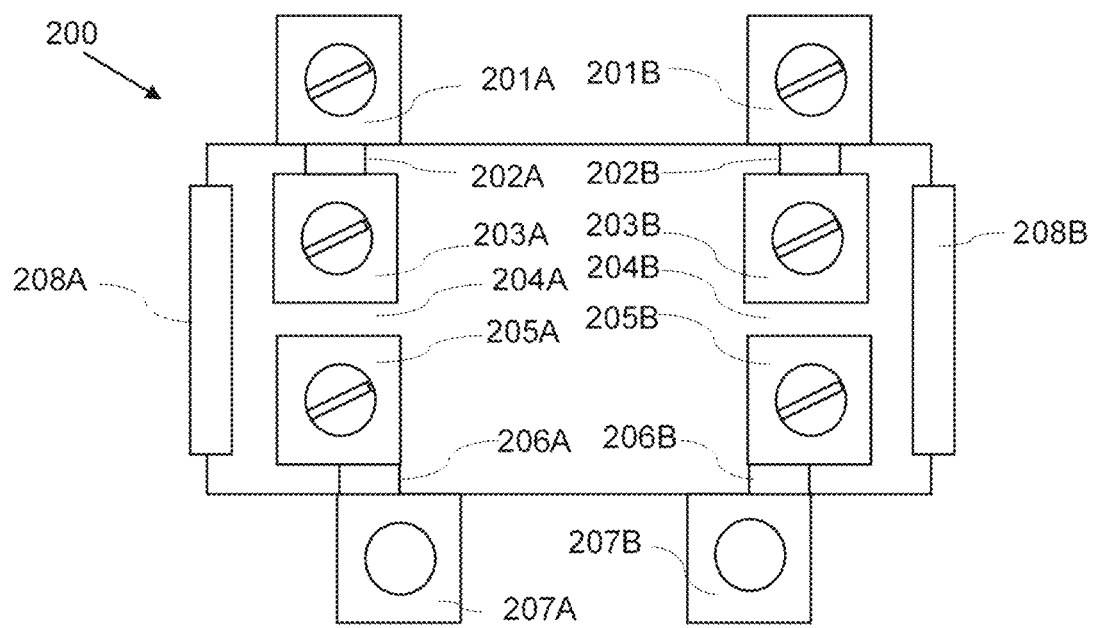
FIG. 11 shows schematically a second embodiment of an adapter for converting a main circuit breaker to internal mechanical lugs, according to illustrative aspects of the disclosure.

Reference is now made to FIG. 11, which shows schematically a second embodiment of an adapter 200 for converting a main circuit breaker location to internal mechanical lugs. Adapter 200 is an example embodiment with mechanical lugs (201A and 201B) to connect meter wires (2 pole) and flanges (207A and 207B) for connecting two busbars on the load-side. Mechanical lugs (201A and 201B) may be respectively electrically connected to supply-side internal mechanical lugs (203A and 203B) using internal conductors (202A and 202B). Flanges (207A and 207B) may be respectively electrically connected to load-side internal mechanical lugs (205A and 205B) using internal conductors (206A and 206B). Supply-side internal mechanical lugs (203A and 203B) may be electrically isolated from load-side internal mechanical lugs (205A and 205B) using electrical isolation (including an isolator 204A and 204B), with electrical isolation being accomplished by use of an isolation material, an air gap, and/or the like. Adapter further comprises one or more ports, including ports 208A and 208B, to allow entry of electrical wires form a PV system to pass into the internal cavity of adapter 200 and electrically connect with internal lugs (203A, 203B, 205A, 205B, and/or the like).

Figure 12:
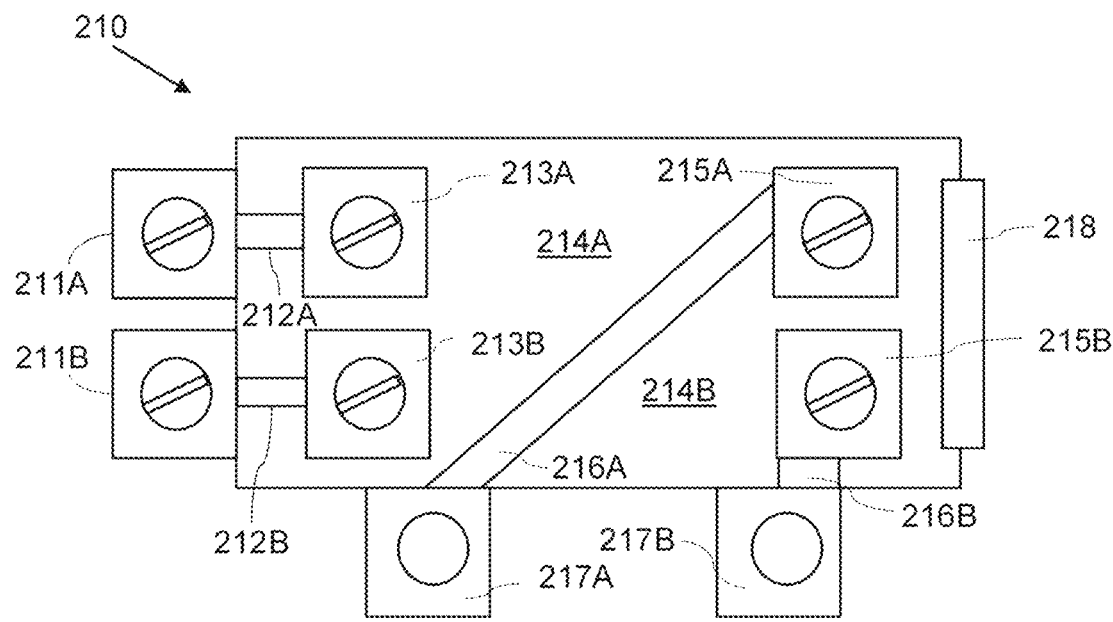
FIG. 12 shows schematically a third embodiment of an adapter for converting a main circuit breaker to internal mechanical lugs, according to illustrative aspects of the disclosure.

Reference is now made to FIG. 12, which shows schematically a third embodiment of an adapter 210 for converting a main circuit breaker location to internal mechanical lugs. Adapter 210 is an example embodiment with mechanical lugs (211A and 211B) to connect meter wires (2 pole) and flanges (217A and 217B) for connecting two busbars on the load-side. Mechanical lugs (211A and 211B) may be located on a lateral side of adapter 210, and respectively electrically connected to supply-side internal mechanical lugs (213A and 213B) using internal conductors (212A and 212B). Flanges (217A and 217B) may be respectively electrically connected to load-side internal mechanical lugs (215A and 215B) using internal conductors (216A and 216B). Supply-side internal mechanical lugs (213A and 213B) may be electrically isolated from load-side internal mechanical lugs (215A and 215B) using electrical isolation (214A and 214B), including electrical isolation accomplished by use of an isolation material, an air gap, and/or the like. Adapter further comprises one or more ports, including ports 218A, to allow entry of electrical wires form a PV system to pass into the internal cavity of adapter 210 and electrically connect with internal lugs (213A, 213B, 215A, 215B, and/or the like).

Figure 13:
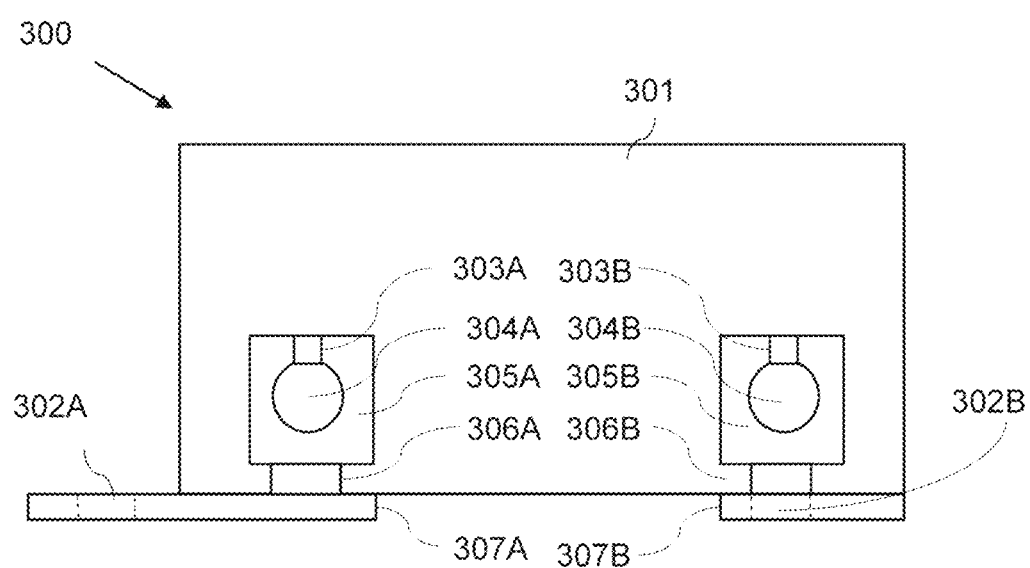
FIG. 13 shows schematically a fourth embodiment of an adapter for converting a main circuit breaker to internal mechanical lugs, according to illustrative aspects of the disclosure.

Reference is now made to FIG. 13, which shows schematically a fourth embodiment of an adapter 300 for converting a main circuit breaker location to internal mechanical lugs. Adapter 300 comprises a housing that defines an internal cavity 301 of adapter 300. A flange 307A electrically connects to a conductor from the utility meter using a bolt hole 302A to connect the utility meter conductor. On the load-side, a mechanical connector 307B may mechanically connect directly to the distribution board frame, while a conductor 302B may electrically connect one or more busbars. An electrical conductor 306A may electrically connect conductive flange 307A to an internal mechanical lug body 305A. An electrical conductor 306B may electrically connect conductor 302B to an internal mechanical lug body 305B. A cylindrical cavity 304A in internal mechanical lug body 305A allows insertion of an electrical wire from a PV system, and a set screw 303A allows firmly attaching the PV system wire to the internal mechanical lug body 305A. Similarly, a second electrical wire from a PV system may be inserted into a second, load-side cylindrical cavity 304B, and a second set screw 303B allows firmly attaching the PV system wire to the internal mechanical lug body 305B.

Figure 14:
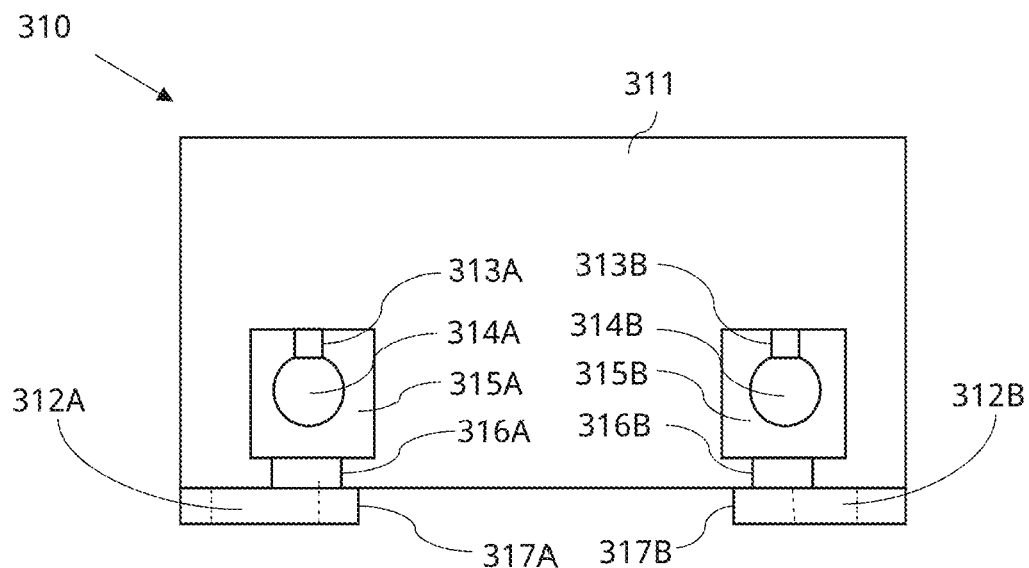
FIG. 14 shows schematically a fifth embodiment of an adapter for converting a main circuit breaker to internal mechanical lugs, according to illustrative aspects of the disclosure.

Reference is now made to FIG. 14, which shows schematically a fifth embodiment of an adapter 310 for converting a main circuit breaker location to internal mechanical lugs. Adapter 310 comprises a housing that defines an internal cavity 311 of adapter 310. A mechanical connector 317A electrically may connect to a conductor from the utility meter using a conductor 312A. On the load-side, a mechanical connector 317B may mechanically connect directly to the distribution board frame, while a conductor 312B may electrically connect one or more busbars. An electrical conductor 316A may electrically connect conductive flange 317A to an internal mechanical lug body 315A. An electrical conductor 316B may electrically connect conductor 312B to an internal mechanical lug body 315B. A cylindrical cavity 314A in internal mechanical lug body 315A allows insertion of an electrical wire from a PV system, and a set screw 313A allows firmly attaching the PV system wire/cable to the internal mechanical lug body 315A. Similarly, a second electrical wire from a PV system may be inserted into a second, load-side cylindrical cavity 314B, and a second set screw 313B allows firmly attaching the PV system wire to the internal mechanical lug body 315B.

The mechanical lug may comprise a screw for securing an electrical wire to an electrical connection. For example, the lug comprises a metal body with a cylindrical cavity configured to receive an electrical wire, and perpendicular to the cylinder axis of the cavity is a threaded screw hole aligned with the center of the cylinder axis. When an end of an electric wire is placed in the cylindrical cavity, a screw may be screwed into the screw hole to secure the wire in the cavity, in which the wire may be secured in cavity by using a set screw. For example, the screw may be a blind set screw with an internal-wrenching head, including a hex socket (Allen), a star (Torx™) socket, square socket (Robertson), a slot, and/or the like.

The mechanical lug may comprise a hole to secure the lug to the adapter, an external electrical connection, and/or the like. For example, a bolt is passed through the hole to connect the lug to a busbar, an electrical connector, and/or the like, and the bolt is secured to a screw hole or bolt to rigidly connect the lug. For example, the hole is located on a flange connected to the metal body of the lug, and a bolt secures the flange to a body of an adapter.

The adapter may comprise one or more ports for passing one or more electrical wires from an electrical device to one or more of the internal lugs. For example, the adapter has two ports for a single pole type distribution board, and one port has an electrical wire going through it from the PV system to an internal lug electrically connected to the electrical meter, and the second port has a second electrical wire from the PV system to an internal lug electrically connected to the load-side circuit breakers. For example, a single port has a stadium shape, a rectangular shape, an oval shape, and/or the like to allow two electrical wires to pass through the single port. The port may be located on the top, bottom, or lateral sides of the adapter. The ports may be located in the body of the adapter.

The main breaker may be relocated to a new location, whereby the new location may be within a utilization unit or subpanel. The main breaker may be incorporated within the adapter.

The following details may be incorporated for functionality of the adapter. Functionalities may be associated with technical features used for implementing the function(s). The following details mention an adapter and/or utilization unit, and other aspects may be disclosed as equivalent, including a subpanel, a portion of the adapter within the distribution board cavity, and/or the like.

The adapter and/or utilization unit may comprise one or more circuit breakers, and may comprise thermal magnetic breakers. For example, an adapter comprises a main circuit breaker, for example, a 20 ampere (A) circuit breaker, a 30 A circuit breaker, a 48 A circuit breaker, a 300 A circuit breaker, a 100 A circuit breaker, a 150 A circuit breaker, a 200 A circuit breaker, a 300 A circuit breaker, or the like.

For example, the adapter and/or utilization unit comprises a ground-fault circuit-interrupter (GFCI) breaker, including a residual-current device, a residual-current circuit breaker, a ground-fault interrupter, an appliance leakage current interrupter, an RCD, a combined RCD+MCB, a residual-current circuit breaker with overcurrent protection, a safety switch, an earth leakage circuit breaker, a residual-current device, and/or the like. For example, the following list is of different types of GFCI technologies that may be incorporated into the adapter:
Square D Homeline 20 Amp 2-Pole GFCI Circuit Breaker Model #HOM220GFIC, General Electric Q-Line 20-Amp Single Pole Ground-Fault Circuit Breaker Model #THQL1120GFP, Siemens 20 Amp Single Pole Type QPF2 GFCI Circuit Breaker Model #US2:QF120AP, Eaton Type BR 20 Amp 1 in. Single Pole Self-Test Ground-Fault Circuit Breaker Model #GFTCB120CS, Murray 20 Amp Double Pole Type MP-GT GFCI Circuit Breaker Model #US2:MP220GFAP, and/or the like.

The adapter and/or utilization unit may comprise an arc-fault circuit interrupter in one implementation.

In another implementation, the adapter and/or utilization unit may comprise a combination breaker, comprising any combination of arc-fault circuit interrupter, GFCI, circuit breaker and/or the like. For example, an adapter comprises a dual function circuit interrupter utilizing both GFCI and AFCI detection technology, and may comprise a combination arc and ground-fault circuit interrupter.

The adapter and/or utilization unit may comprise one or more sensors. For example, an adapter may comprise any combination of the following sensors:
a time sensor,
a location sensor,
a temperature sensor,
an electrical current sensor,
an electrical voltage sensor,
an electrical energy sensor,
an electrical power sensor,
an electrical phase sensor,
a humidity sensor,
an electromagnetic radiation sensor,
and/or the like.

The adapter device may comprise one or more switches. For example, a solenoid switch may be used to change from a grid-available configuration to a backup power situation. For example, multiple switches may be used to change between different configurations, including any combination of:
a grid-available configuration,
a backup power configuration,
a solar power configuration,
a turbine power configuration,
and/or the like.

The adapter and/or utilization unit may comprise one or more electrical meters. For example, an electrical power and/or current meter may be incorporated into an adapter for measuring standby power.

The adapter and/or utilization unit may comprise one or more one or more solar power inverters. For example, a micro-inverter may be incorporated into the adapter to feed power from the PV system to the grid, to supply power to the distribution board loads, and/or the like.

The adapter and/or utilization unit may comprise one or more shunt trip devices. For example, a remote activated shunt trip may be incorporated into the adapter to enable emergency electrical shutdown.

The adapter and/or utilization unit may comprise one or more digital and/or analog communication devices. For example, a digital communication transceiver may be incorporated into the adapter to send and receive digital messages from a smartphone, a server, a laptop, a tablet, and/or the like.

The adapter and/or utilization unit may comprise one or more alarm and/or notification devices. For example, an acoustic alarm may be incorporated into the adapter to present an audible alarm to a user of the distribution board when one or more conditions exist, and may be incorporated in the distribution board, in the electrical grid, in the PV system, and/or the like.

The adapter and/or utilization unit may comprise at least one under-voltage trip device.

A combination (including any combination) of aspects of embodiments may be modularly incorporated into the adapter and/or utilization unit and/or subpanel according to the requirements for a particular installation.

The adapter may comprise a cavity extending past the original boundaries of the main circuit breaker, and may protrude into areas surrounding the main breaker, to allow incorporation of the lugs, sensors, meters, inverters, circuit breaker mechanisms, and/or the like. For example, the adapted incorporates a main breaker and mechanical lugs for a supply-side interconnection of a PV system, where the lugs may be incorporated into a portion of the adapter extending away from the main break, the busbars, the meter wires, and/or the like.

Figure 15:
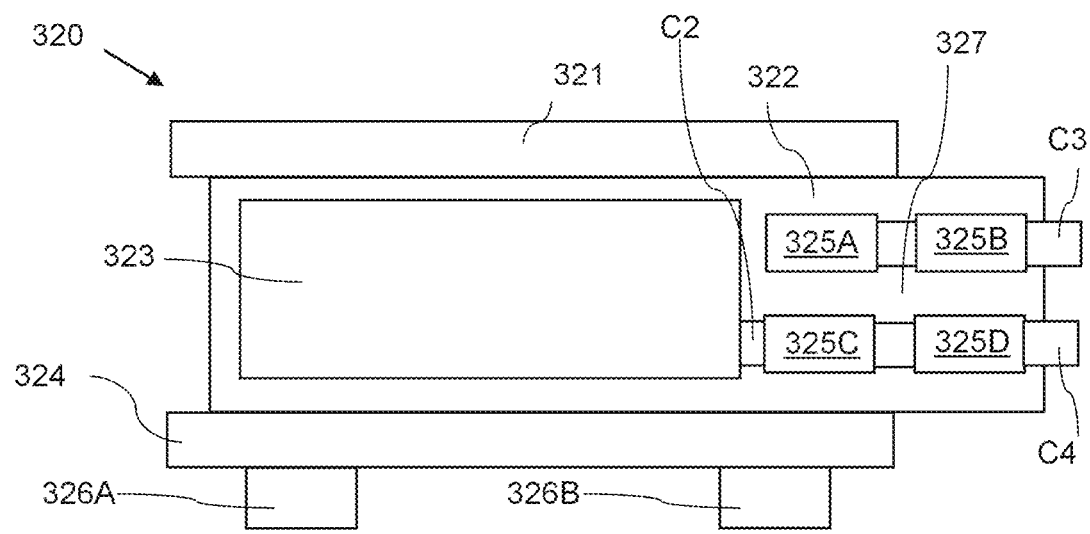
FIG. 15 shows schematically a sixth embodiment of an adapter for converting a main circuit breaker to internal mechanical lugs, according to illustrative aspects of the disclosure.

Reference is now made to FIG. 15, which shows schematically a sixth embodiment of an adapter 320 for converting a main circuit breaker to internal mechanical lugs. Adapter 320 comprises a cover 321, body 322, and base 324. Body 322 comprises a main circuit breaker 323 and mechanical lugs 325A, 325B, 325C, and 325D, such that the main circuit breaker is located in a typical position for the distribution board. Adapter 320 may be mechanically connected to the distribution board using connectors 326A and 326B. The lugs at least in part may be located at a position adjacent to the main breaker, but outside (at least in part) the space normally occupied by the main breaker. The lugs may be added to the distribution board for a supply-side interconnection for the PV system without relocating the main breaker from the normal position on the distribution board and avoiding possible regulation issues. For example, mechanical lug 325A may be electrically connected to a meter as depicted in FIGS. 5, 6, 7, and 8. For example, mechanical lug 325B may be electrically connected to mechanical lug 325A and a utilization unit (30 of FIGS. 5, 6, and 7) and thereby to a power generation system (22 of FIGS. 5, 6, 7, and 8). For example, connection C3 of FIG. 7 shows a connection between a utility side of an adapter and a utilization unit, and is juxtaposed in FIG. 15. For example, mechanical lug 325C may be connected to circuit breaker 323, such as using electrical connection C2 of FIG. 7, and juxtaposed in FIG. 15. For example, mechanical lug 325D may be connected to a load side of a utilization unit (30 of FIGS. 5, 6, and 7) and thereby to a power generation system (22 of FIGS. 5, 6, and 7). For example, connection C4 of FIG. 7 shows a connection between a utility side of an adapter 325B and a utilization unit, and juxtaposed in FIG. 15. Mechanical lugs 325A and 325B may be electrically isolated from mechanical lugs 325C and 325D, such as in the adapters of FIGS. 10-14. For example, an air gap 327 may provide electrical isolation of mechanical lugs 325A and 325B from mechanical lugs 325C and 325D.

The adapter and/or utilization unit may comprise a switch for connecting a battery backup in addition to the mechanical lugs for connecting the PV system. For example, the switch allows connecting a battery backup when the electrical supply fails and the PV system is not producing power, for example, during the night, and/or the like. For example, the battery backup may be connected before the power from the PV system is provided to the busbars and subsequently to the load-side circuit breakers. For example, the load-side circuit breaker comprises switches that may be tripped on command from another component, thus disconnecting some of the loads from the distribution board when the backup power is triggered, whereby the disconnecting may occur when the load is a non-essential load. For example, floor heaters may be disconnected from the distribution board when the backup power is triggered.

Described hereinbelow are aspects describing details of a meter adapter, though such aspects may be common to all adapters. Any combination of aspects from one type of adapter may be applicable to other types of adapters. Use of a particular type of adapter as an example or to explain the aspects of the details is not exclusive to that adapter and may apply to all adapters. For example, a circuit breaker may be provided in a meter adapter, a main circuit breaker adapter, a load circuit breaker adapter, and/or the like. Similarly, disclosed aspects and/or details may be distributed between an adapter, a utilization unit, a subpanel, a cavity, and/or the like.

Figure 16:
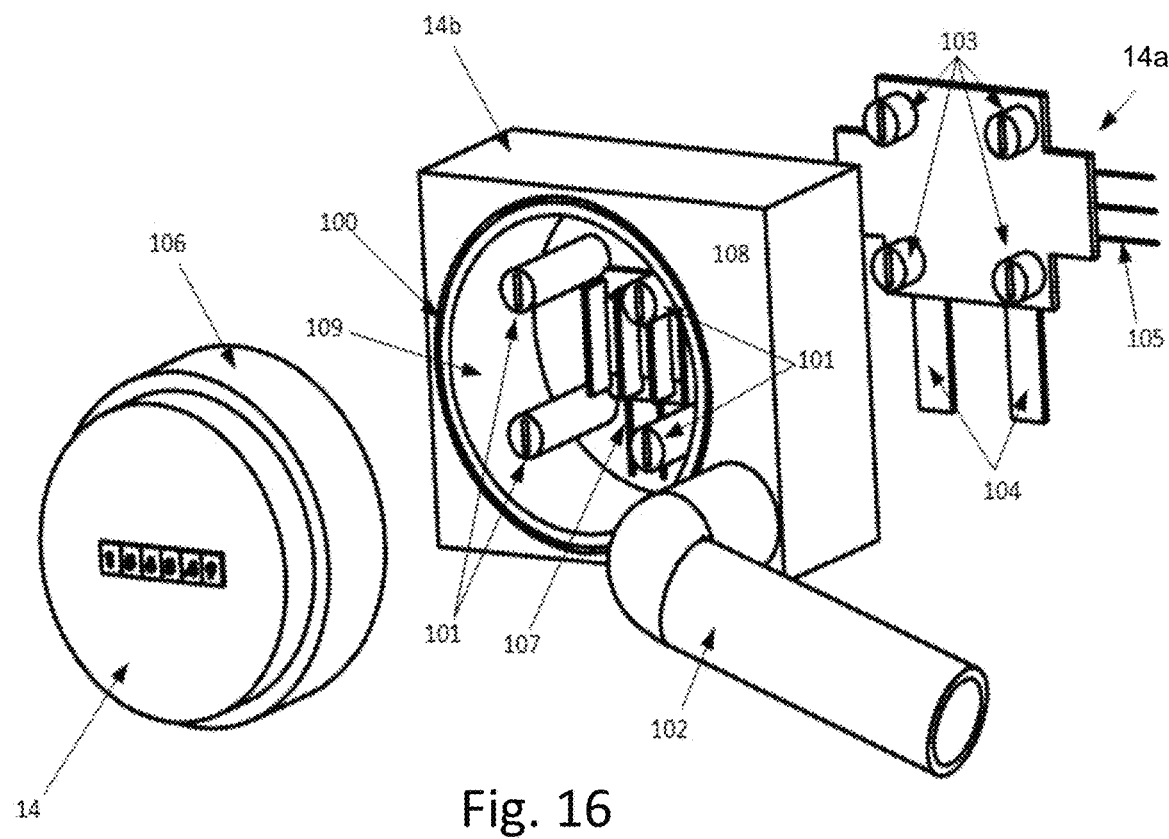
FIG. 16 shows schematically an isometric drawing of adapter in relation to a meter and a socket termination, according to illustrative aspects of the disclosure.

Reference is now made to FIG. 16, which shows an isometric drawing of adapter 14b in relation to a meter 14 and a socket termination 14a according to illustrative aspects of the disclosure. Socket termination 14a may be mounted in an electric box (not shown). In some aspects, socket termination 14a may be mounted in the same electric box as main circuit breaker 16 and/or distribution board 19, and in other aspects socket termination 14a may be mounted in a different electric box than the electric box used to house main circuit breaker 16 and/or distribution board 19. Socket termination 14a may include bus bars 104 configured to electrically couple to a utility supply (utility supply 10). In some aspects, bus bars 104 may be replaced by connectors and/or conductors configured to electrically couple to the utility supply conductors. The number of bus bars 104 may depend on utility supply 10, for example, when the supply of utility supply 10 is single phase there may be one or two bus bars, and when utility supply 10 is three-phase there may be at least three bus bars.

In some aspects, socket termination 14a may have one or more receptacles 103. One or more of receptacles 103 may be electrically coupled to bus bars 104. Receptacles 103 may be configured to receive conductive prongs protruding from meter 14 (not shown because of the angle of meter 14 as shown in FIG. 16). Conductive prongs protruding from meter 14 may provide, when coupled to receptacles 103, a short circuit between receptacles 103 and output 105, such that current flowing from bus bars 104 to output 105 may flow from receptacles 103 through meter 14 and out through output 105.

In some aspects, between meter 14 and socket termination 14a may comprise adapter 14b. Adapter 14b may have female sockets or receptacles 101 that may be similar to receptacles 103. Meter 14 may electrically couple to adapter 14b using receptacles 101. In some aspects, meter 14 may also connect to adapter 14b by fitting into slot 100 of adapter 14b. Slot 100 may be designed to serve as a receptacle for a protruding exterior 106 of meter 14. Slot 100 may include protrusions/slots so as to enable correct insertion of meter 14 (that may have corresponding protrusions/slots) to adapter 14b and/or slot 100 may be of a certain orientation to ensure correct insertion of meter 14 into adapter 14b. Similar consideration may be made with respect protrusions/slots to ensure correct insertion of adapter 14b into socket termination 14a. According to some aspects, protruding exterior 106 may lock into slot 100 with a locking mechanism (not shown), for example, a latch, push-and-turn mechanism, etc. In some aspects, adapter 14b may be configured to output electricity through an output 107 rather than output 105 connected to distribution board 19.

Adapter 14b may have protruding prongs configured to connect to receptacles 103 of socket termination 14a. When protruding prongs of adapter 14b are connected to receptacles 103 of socket termination 14a, and protruding prongs of meter 14 are connected to receptacles 101 of adapter 14b, current may flow from bus bars 104 to output 107. According to some aspects, adapter 14b may include output 107 coupled to conductors housed in a conduit 102. Conduit 102 may be connected to front 108 of adapter 14b. Output 107 connected to conductors housed in conduit 102 may be configured to electrically couple to a load, distribution box, storage device, generator, etc. According to some aspects, adapter 14b may be a rectangular shape as shown in FIG. 6, and according to other aspects, adapter 14b may have a different shape, including a square shape, hexagon shape, decagon shape, etc. According to some aspects, adapter 14b may include conduit 102 connected to front 108 of adapter 14b, and according to some aspects, conduit 102 may be connected to a different side of adapter 14b. A rectangular shape of adapter 14b with conduit 102 connected to the front of adapter 14b may be particularly useful where a plurality of adapters 14b are installed side by side, for example, in an electric box of a building having multiple housing units, each housing unit having a dedicated meter. In this case, a plurality of adapters 14b are easily installed side by said, with conduits protruding from the front. In other cases, adapter 14b may be of reduced size by being round shape, a hexagon shape, octagon shape or decagon shape, with conduit 102 connected to the side of adapter 14b.

In some aspects, conduit 102 might not be featured, and output 107 may be coupled to conductors configured to transfer electricity from output 107 through one of the sides of adapter 14b. According to some aspects, adapter 14b may have an inner area 109 designed to house certain components of adapter 14b, including receptacles 101 and/or output 107, and to be sealed by meter 14.

According to some aspects, receptacles 101 and/or 103 may be positioned to prevent connecting respective conductive protruded prongs from meter 14 and/or adapter 14b to the wrong respective receptacles of receptacles 101 and/or 103. For example, receptacles 103 may have one receptacle electrically coupled to a positive line from bus bars 104 and one receptacle electrically coupled to a negative line from bus bars 104. As well as a positive and negative line, one receptacle may be electrically coupled to the ground and one receptacle may be electrically coupled to neutral. The positive and negative receptacles of receptacles 103 may be slanted with regard to the neutral and ground receptacles of receptacles 103. Another example may be the distance between the receptacles of receptacles 103. The positive and negative receptacle may be distanced from each other at a first distance, and the ground and neutral receptacles of receptacles 103 may be distanced at a second distance different than the first distance.

Figure 17:
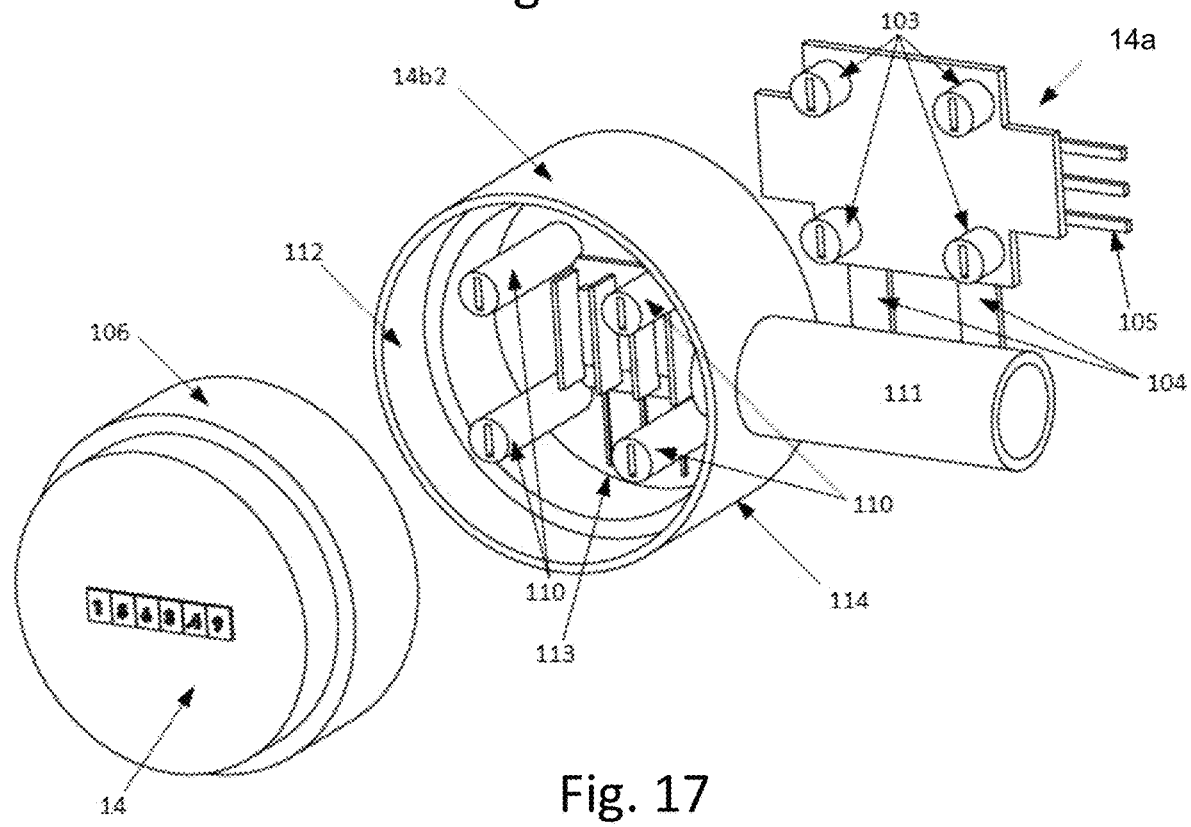
FIG. 17 illustrates schematically an adapter in relation to a meter and a socket termination, according to illustrative aspects of the disclosure.

Reference is now made to FIG. 17, which illustrates an adapter 14b2 in relation to a meter 14 and a socket termination 14a according to illustrative aspects of the disclosure. Adapter 14b2 may be circular rather than decagonal as is shown in FIG. 6. Adapter 14b2 may have receptacles 110 that may be the same as receptacles 101 of adapter 14b in FIG. 16. Adapter 14b2 may have an interior 112 and an exterior 114. Housed in interior 112 may be receptacles 110 and an output 113. According to some aspects, adapter 14b2 may be configured to connect to conduit 111 on exterior 114. Adapter 14b2 may have conductive protruding prongs (not shown) configured to connect to receptacles 103 of socket termination 14a. Receptacles 110 may be configured to connect to protruding conductive prongs of meter 14. Adapter 14b2 may be configured to connect to meter 14, with receptacles 110 connecting to respective prongs, by fitting exterior 106 of meter 14 into interior 112 of adapter 14b2. Meter 14 may be fit into adapter 14b2 using pressure or force. According to some aspects, fitting meter 14 into adapter 14b2 may include a push-and-turn mechanism and/or a locking mechanism, and may include a latch mounted on adapter 14b2 and a respective part mounted on meter 14 configured to connect to the locking mechanism. In both FIGS. 16 and 17, elements of utilization unit 30 shown in further detail in FIG. 9 may be mounted and connected in the housing of adapters 14/14b2.

Figure 18:
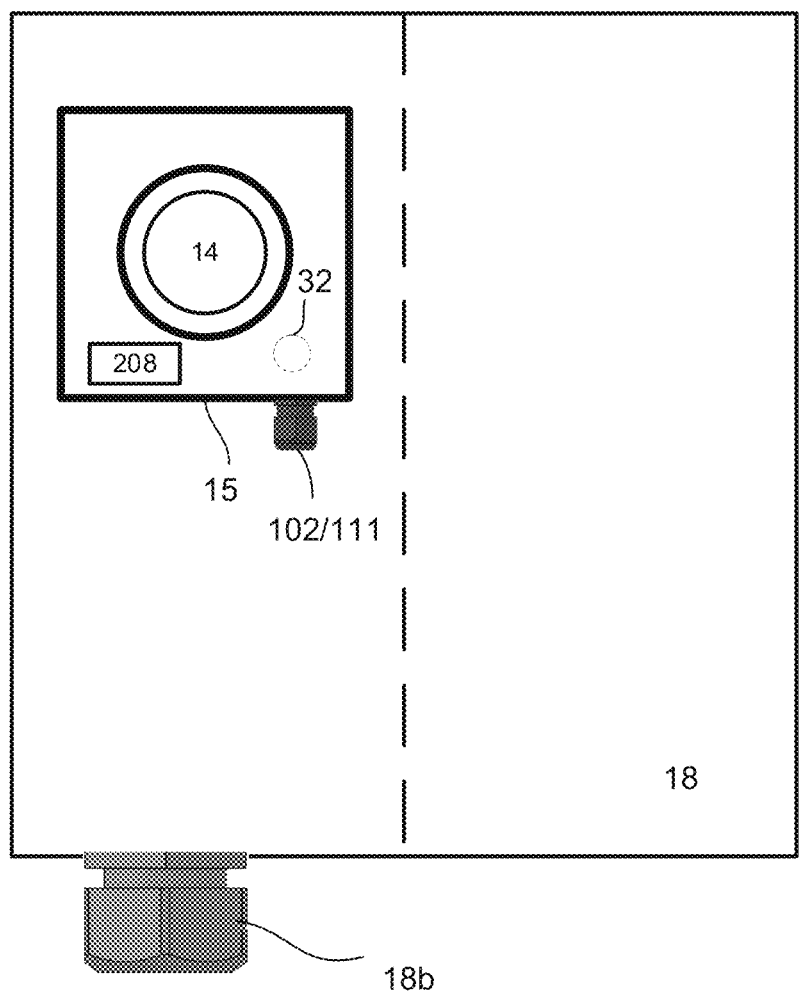
FIG. 18 shows schematically a housing that includes an adapter, according to illustrative aspects of the disclosure.

Reference is now made to FIG. 18, which shows a plan view of housing 18 that includes adapter 14b, according to illustrative aspects of the disclosure. Meter 14 is shown inserted into adapter 14b and adapter 14b is inserted into socket termination 14a (not shown). Housing 18 includes a gland 18b (e.g., cable connector) that may be used to secure and attach a cable (not shown) to housing 18. The cable may include conductors that may be terminated in protection unit 12 (not shown) that may be located inside housing 18 to the left of an isolation barrier shown by dotted line. The cable may be used to connect utility supply 10 to protection unit 12 (not shown) that may be located inside housing 18. A conduit or cable gland 32 may be made in housing 18 as part of a retrofit of housing 18 that includes adapter 14b when the items/components of utilization unit 30 are housed in the housing of adapter 14b according to certain features of the disclosure herein. As such, the output of utilization unit 30 ($L_{1out}$, $L_{2out}$) may be connected to distribution board 19 if, in accordance with certain features of the disclosure herein, distribution board 19 is located in housing 18. When distribution board 19 is located away from housing 18, then adapter 14b may provide a gland or conduit 102/111 that enables the output of utilization unit 30 ($L_{1out}$, $L_{2out}$) to be connected distribution board 19 via cable and/or conductors passing through conduit 102/111 to be terminated in distribution board 19.

When utilization unit 30 is housed in another housing separate to the housing of adapter 14b, the output of adapter 14b may be connected to the input of utilization unit 30 via use of gland or conduit 102/111 via cable and/or conductors passing through conduit 102/111 to be terminated in utilization unit 30. In this case utilization unit 30 may also include a gland or a conduit that enables connection between the output of utilization unit 30 ($L_{1out}$, $L_{2out}$) to distribution board 19 that may be located inside housing 18 or housed in another housing separate to the housings of utilization unit 30.

Figure 19:
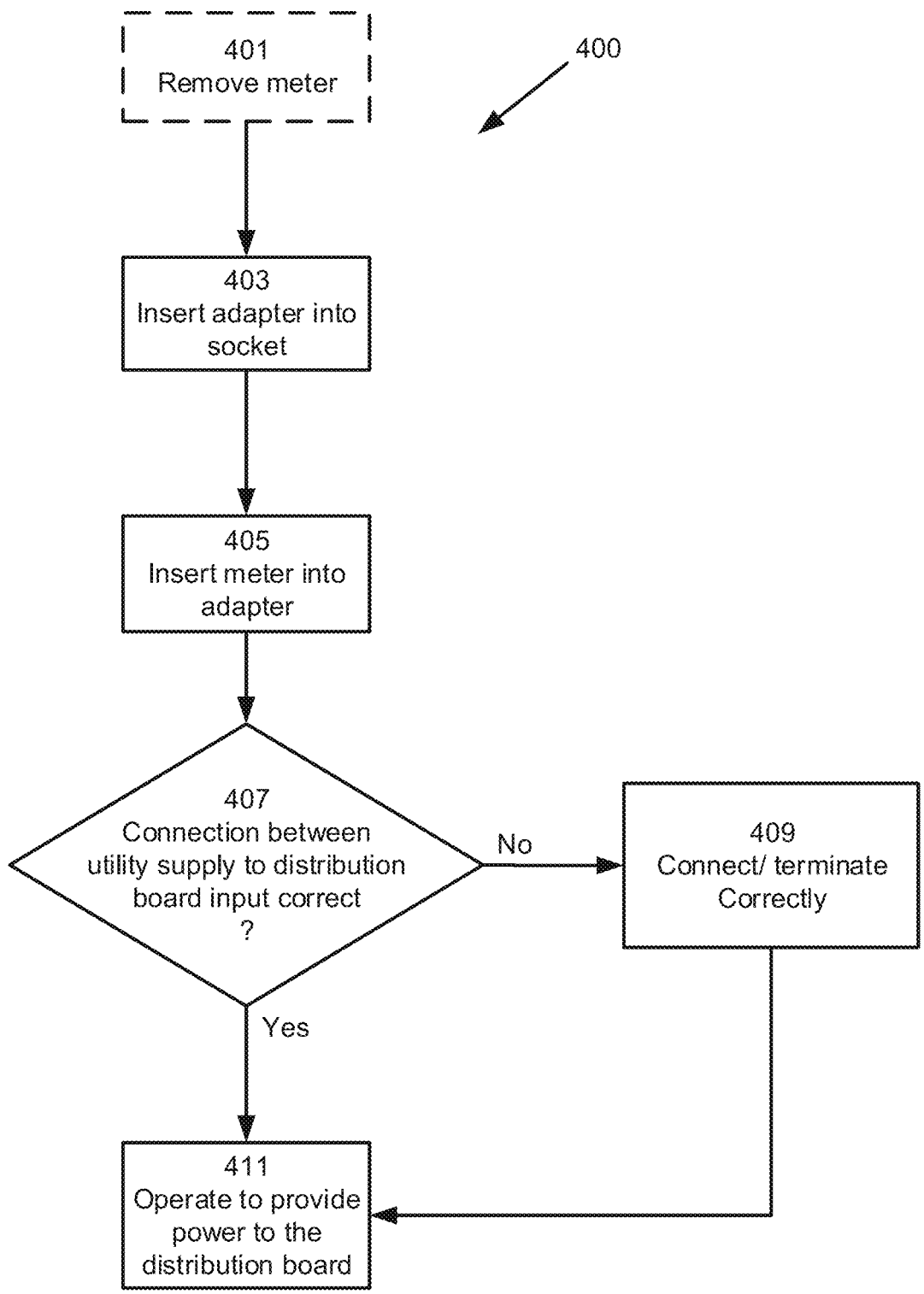
FIG. 19 shows a flow chart of a method for installing a meter adapter, according to illustrative aspects of the disclosure.

Reference is now made to FIG. 19, which shows a flow chart of a method 400 for installing an adapter, according to illustrative aspects of the disclosure. Method 400 may involve connecting adapter 14b to an existing system and/or installation of a system to supply electrical power to an installation that may include the features provided by utilization unit 30. The description with regard to FIG. 19 may reference elements described in prior figures. The installation may include the feature of providing power from utility supply 10 and/or power conductors P1, P2, and/or P3 to a distribution board 19. In order to safely work on the installation, an operative may ensure that circuit breakers and/or isolation switches of protection unit 12 are turned OFF to provide a safe environment for working on the installation. At step 401, meter 14 of FIG. 18 may be unplugged from socket termination 14a of FIG. 16, which may be housed in housing 18. Distribution board 19 of FIGS. 5 thru 6 may be also housed in housing 18 of FIG. 18 or be located in another housing away from housing 18. As such, when distribution board 19 is located in another housing away from housing 18, ways to connect distribution board 19 to termination inside housing 18 may be provided. Examples of ways to connect between utility supply 10, utilization unit 30 and distribution board may include cables, conduits, bus bars and/or trunking.

At step 403, adapter 14b may be inserted into socket termination 14a. With reference to FIGS. 5 and 6, the insertion of adapter 14b into socket termination 14a and without meter 14 plugged into adapter 14b, the connection between utility supply 10/protection unit 12 and distribution board may be disconnected.

At step 405, insertion of meter 14 into adapter 14b enables a connection of utility supply 10/protection unit 12 and distribution board 19 to go via utilization unit 30. Insertion of meter 14 into adapter 14b enables a connection of utility supply 10/protection unit 12 to I/O port 20a of utilization unit 30 (e.g., as shown in FIG. 5).

At step 407, an installer for example may check that the connection between utility supply 10/protection unit 12 to I/O port 20a is correct in terms of polarity, insulation resistance, ground/earth leakage, and continuity for example. The installer may also ensure that the connection between the output of utilization unit 30 to distribution board 19 is also correct. The connection between the output of utilization unit 30 to distribution board 19 may be as shown in FIG. 18 where conduit or cable gland 32 may be made in housing 18 as part of a retrofit of housing 18 that includes adapter 14*b* when the items/components of utilization unit 30 are also housed in the housing of adapter 14*b*. The output of utilization unit 30 ($L_{1out}$, $L_{2out}$) may be connected to distribution board 19 when distribution board 19 is located in housing 18. When distribution board 19 is located away from the housing of adapter 14*b* (e.g., housing 18), adapter 14*b* may provide a gland or conduit 102/111 that enables the output of utilization unit 30 ($L_{1out}$, $L_{2out}$) to be connected distribution board 19 via cable and/or conductors passing through conduit 102/111 to be terminated in distribution board 19. Where distribution board 19 and/or utilization unit 30 are separately housed and located away from housing 18, adapter 14*b* might not include the items/components of utilization unit 30. Cables and/or conductors passing through conduit 102/111 of adapter 14*b* may be terminated in I/O port 20*a* of utilization and then cables may be provided to connect between the output utilization unit 30 ($L_{1out}$, $L_{2out}$) and distribution board 19.

When the connections described above are not made correctly as of the evaluation at step 407, they are corrected at step 409. Once the connections are correct, normal operation of supplying power to distribution board 19 from utility supply 10 via utilization unit 30 may continue according to a configuration of controller 31. As such, the supplying of power to distribution board 19 from utility supply 10 and/or via utilization unit 30 may be by a number of modes of operation specified by the configuration (e.g., the first, second, third and fourth modes as described with regard to FIG. 7). Additionally, the configuration may be updated, monitored and/or controlled by remote means via an internet connection or an operative in proximity to utilization unit 20, for example, using a user-device (e.g., a smart phone or tablet) providing the internet connection and/or the user device itself enabling the updates, modes of operation and configuration.

For example, an installation may presently not have approval for the installation-connected converters 24*a* and 24*b* to be used as DC to AC inverters to connect and to supply power to utility supply 10. As such, power supplied to distribution board 19 may be from either utility supply 10 or power conductors P1, P2, and/or P3. Use of power conductors P1, P2, or P3 may commence when utility supply 10 fails (sensed by sensors/sensor interface 33), or when a consumer chooses to supply power conductors P1, P2, and/or P3 instead of utility supply 10. Upon approval (e.g., by a relevant authority such as a utility company) of converters 24, an update to the configuration of utilization unit 30 may be made so as to supply power to utility supply 10 and/or distribution board 19.

Figure 20:
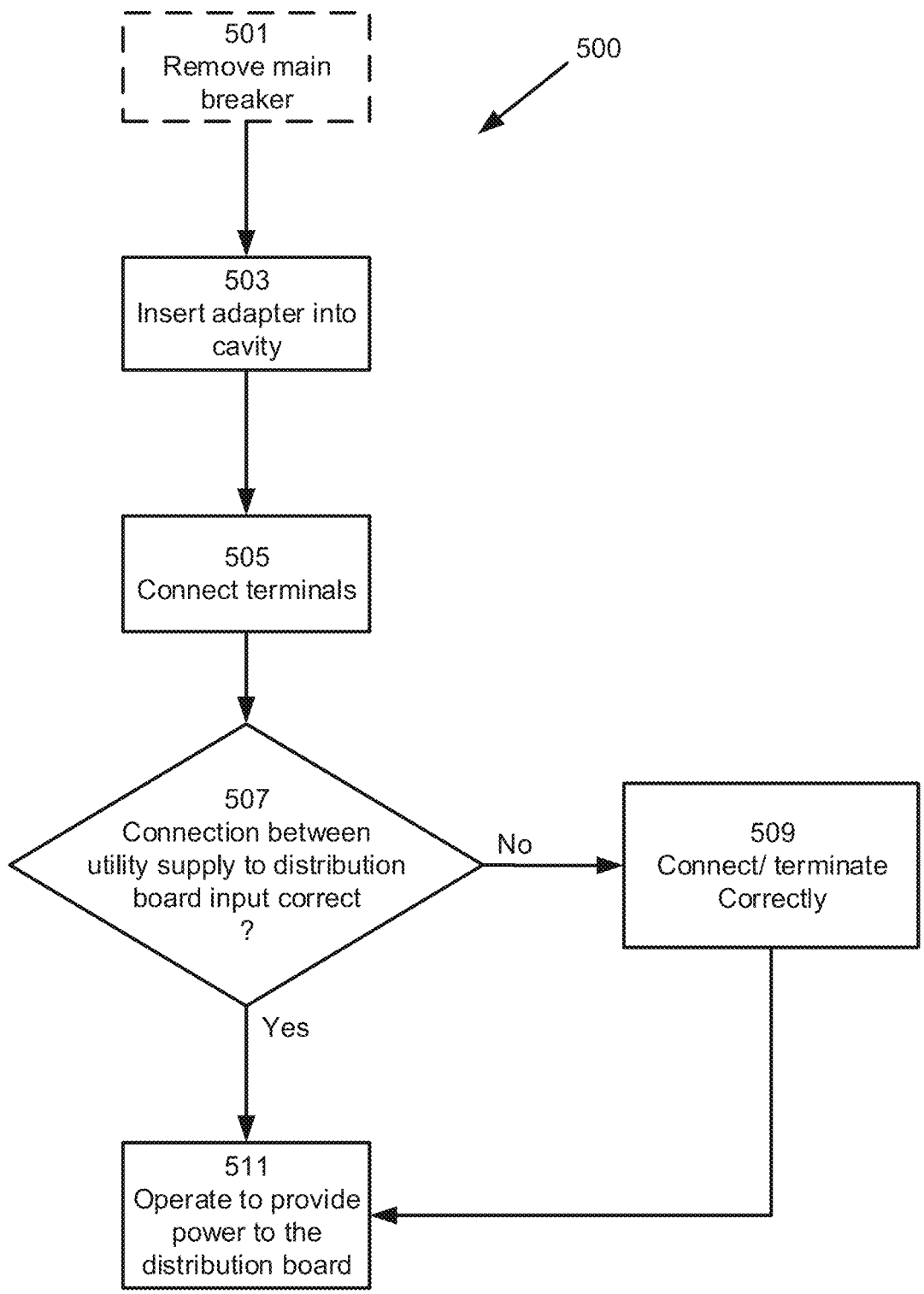
FIG. 20 shows a flow chart of a method for installing a meter adapter, according to illustrative aspects of the disclosure

Reference is now made to FIG. 20, which shows a flow chart of a method 500 for installing an adapter, according to illustrative aspects of the disclosure. Method 500 may involve connecting adapter 16*b* to an existing system and/or installation of a system to supply electrical power to an installation that may include the features provided by utilization unit 30. The description with regard to FIG. 20 may reference elements described in prior figures. The installation may include the feature of providing power from utility supply 10 and/or power conductors P1, P2, and/or P3 to a distribution board 19. In order to work on the installation, an operative may ensure that circuit breakers and/or isolation switches of protection unit 12 are turned OFF to provide a safe environment for working on the installation. At step 501, main circuit breaker 16 of FIG. 2 may be dismantled from distribution board 19 of FIG. 2, which may be housed in housing 18. Distribution board 19 of FIGS. 5 thru 6 may be also housed in housing 18 of FIG. 2 or be located in another housing away from housing 18. As such, when distribution board 19 is located in another housing away from housing 18, ways to connect distribution board 19 to termination inside housing 18 may be provided. Examples of ways to connect between utility supply 10, utilization unit 30 and distribution board 19 may include cables, conduits, bus bars and/or trunking, for example.

At step 503, adapter 16*b* may be inserted into distribution board 19. With reference to FIGS. 5 and 6, the insertion of adapter 16*b* into distribution board 19, the connection between utility supply 10/protection unit 12 and distribution board may be disconnected.

At step 505, connection of utility supply 10/protection unit 12 and distribution board 19 to go via utilization unit 30. As such, connection of utility supply 10/protection unit 12 to I/O port 20*a* of utilization unit 30 (e.g., as shown in FIG. 5) establishes electrical supply service to distribution board 19.

At step 507, an installer for example may check that the connection between utility supply 10/protection unit 12 to I/O port 20*a* is correct in terms of polarity, insulation resistance, ground/earth leakage, and continuity for example. The installer may also ensure that the connection between the output of utilization unit 30 to distribution board 19 is also correct. The connection between the output of utilization unit 30 to distribution board 19 may be as shown in FIG. 18 where conduit or cable gland 32 may be made in housing 18 as part of a retrofit of housing 18 that includes adapter 16*b* when the items/components of utilization unit 30 are also housed in the housing of adapter 16*b*. The output of utilization unit 30 ($L_{1out}$, $L_{2out}$) may be connected to distribution board 19 when distribution board 19 is located in housing 18. Where distribution board 19 and/or utilization unit 30 are separately housed and located away from housing 18, adapter 16*b* might not include the items/components of utilization unit 30.

When the connections described above are not made correctly as of the evaluation at step 507, they are corrected at step 509. Once the connections are correct, normal operation of supplying power to distribution board 19 from utility supply 10 via utilization unit 30 may continue according to a configuration of controller 31. As such, the supplying of power to distribution board 19 from utility supply 10 and/or via utilization unit 30 may be by a number of modes of operation specified by the configuration (e.g., the first, second, third and fourth modes as described with regard to FIG. 7). Additionally, the configuration may be updated, monitored and/or controlled by remote means via an internet connection or an operative in proximity to utilization unit 30, for example, using a user-device (e.g., a smart phone or tablet) providing the internet connection and/or the user device itself enabling the updates, modes of operation and configuration.

One or more illustrative aspects of the disclosure herein may include a general-purpose or special-purpose computer system including various computer hardware components, which are discussed in greater detail below. Various embodiments herein may also include computer-readable media for carrying or having computer-executable instructions, computer-readable instructions, or data structures stored thereon. Such computer-readable media may be any available media, which may be accessible by a general-purpose or special-purpose computer system. By way of example, and not limitation, such computer-readable media can include non-transitory computer-readable media. Such computer-readable media can include physical storage media including RAM, ROM, EPROM, flash disk, CD-ROM or other optical disk storage, magnetic disk storage or other magnetic storage devices, or any other media that can be used to carry or store desired program code mechanisms in the form of computer-executable instructions, computer-readable instructions, or data structures and that may be accessed by a general-purpose or special-purpose computer system.

In this description and in the following claims, a "computer system" may be defined as one or more software or firmware modules, one or more hardware modules, or combinations thereof, which work together to perform operations on electronic data. For example, the definition of computer system may include the hardware components of a personal computer, as well as software or firmware modules, including the operating system of the personal computer. The physical layout of the modules may be not important. A computer system may include one or more computers connected via a computer network. Likewise, a computer system may include a single physical device (e.g., a smart-phone) where internal modules (e.g., a memory and a processor) work together to perform operations on electronic data. While any computer system may be mobile, the term "mobile computer system" especially may include laptop computers, net-book computers, cellular telephones, smart-phones, wireless telephones, personal digital assistants, portable computers with touch sensitive screens and the like.

In this description and in the following claims, a "network" may be defined as any architecture where two or more computer systems may exchange data. The term "network" may include wide area network, Internet local area network, Intranet, wireless networks such as "Wi-Fi", virtual private networks, mobile access network using access point name (APN) and Internet. Exchanged data may be in the form of electrical signals that are meaningful to the two or more computer systems. When data may be transferred, or provided over a network or another communication connection (either hard wired, wireless, or a combination of hard wired or wireless) to a computer system or computer device, the connection may be properly viewed as a computer-readable medium. Thus, any such connection may be properly termed a computer-readable medium. Combinations of the above should also be included within the scope of computer-readable media. Computer-executable instructions include, for example, instructions and data that cause a general-purpose computer system or special-purpose computer system to perform a certain function or group of functions.

The term "server" as used herein, refers to a computer system including a processor, data storage and a network adapter generally configured to provide a service over the computer network. A computer system that receives a service provided by the server may be known as a "client" computer system. The term "data" as used herein refers to a processed analogue signal, the processing including analogue to digital conversion into digital information accessible to a computer system.

It may be noted that various connections are set forth between elements herein. These connections are described in general and, unless specified otherwise, may be direct or indirect; this specification may be not intended to be limiting in this respect. Further, elements of one embodiment may be combined with elements from other embodiments in appropriate combinations or sub-combinations. For example, conductors C3 and C4 of FIG. 7 may be routed side by side through conduit 102 of FIG. 16 or conduit 111 of FIG. 17. As another example, switch S4 of FIG. 7 may be similarly disposed in adapter 14b/16b of FIG. 5 or adapter 14b/16b of FIG. 6.

All optional and preferred features and modifications of the described embodiments and dependent claims are usable in all aspects of the invention taught herein. Furthermore, the individual features of the dependent claims, as well as all optional and preferred features and modifications of the described embodiments are combinable and interchangeable with one another.

What is claimed is:

1. An assembly comprising, for a phase of an electrical distribution panel:
    a utility-side electrical connector configured to be connected to a power meter conductor,
    a circuit breaker comprising a load-side electrical connector configured to be connected to a load-side electrical conductor of an electrical distribution panel,
    a first mechanical lug electrically connected to the utility-side electrical connector, and
    a second mechanical lug electrically connected to the circuit breaker,
    wherein the first mechanical lug and the circuit breaker are electrically isolated.

2. The assembly of claim 1, further comprising a front panel configured to provide a dead-front to the electrical distribution panel.

3. The assembly of claim 1, further comprising a port configured to connect electrical wires to the first mechanical lug or the second mechanical lug.

4. The assembly of claim 1, further comprising a base that mechanically connects to a mechanical connector in the electrical distribution panel, and wherein the mechanical connector in the electrical distribution panel is configured to attach the assembly to the electrical distribution panel.

5. The assembly of claim 1, further comprising a housing, wherein the utility-side electrical connector and the load-side electrical connector are disposed within the housing.

6. The assembly of claim 5, wherein the housing is mechanically connected to the electrical distribution panel.

7. The assembly of claim 1, wherein the utility-side electrical connector is configured to electrically connect to a power meter.

8. The assembly of claim 1, wherein the load-side electrical connector is configured to electrically connect to a load.

9. The assembly of claim 1, further comprising at least one from the group consisting of a switch, a sensor, a relay, an electrical meter, an inverter, a micro-inverter, a communication device, a shunt trip device, an audible alarm, an arc-fault protection device, and a ground-fault protection device.

10. The assembly of claim 1, wherein at least one of the utility-side electrical connector, the load-side electrical connector, the first mechanical lug, and the second mechanical lug is configured to be electrically connected to at least one selected from the group consisting of an alternative energy source, a battery backup, a solar power generation system, a wind power generation system, a backup electricity generator, a geothermal power generation system, a biofuel power generation system, and a hydroelectricity power generation system.

11. The assembly of claim 2, wherein at least one of the utility-side electrical connector, the load-side electrical connector, the first mechanical lug, and the second mechanical lug is located under the dead-front of the electrical distribution panel.

12. The assembly of claim 1, wherein the circuit breaker comprises at least one from the group consisting of a thermal magnetic circuit breaker, a ground-fault circuit-interrupter breaker, a residual-current circuit breaker, and an arc-fault circuit-interrupter breaker.

13. The assembly of claim 1, further comprising a sensor from the group consisting of a time sensor, a location sensor, a temperature sensor, an electrical current sensor, an electrical voltage sensor, an electrical energy sensor, an electrical power sensor, an electrical phase sensor, a humidity sensor, and an electromagnetic radiation sensor.

14. A method comprising:
  mechanically connecting an assembly to an electrical distribution panel substantially at a location of a main circuit breaker, the assembly comprising for a phase of an electrical distribution panel:
    a utility-side electrical connector configured to be connected to a power meter conductor,
    a circuit breaker comprising a load-side electrical connector configured to be connected to a load-side conductor of the electrical distribution panel,
    a first mechanical lug electrically connected to the utility-side electrical connector, and
    a second mechanical lug electrically connected to the circuit breaker,
    wherein the first mechanical lug and the circuit breaker are electrically isolated,
  electrically connecting the utility-side electrical connector to the power meter conductor;
  electrically connecting the load-side electrical connector to a busbar of the electrical distribution panel; and
  electrically connecting at least one of the first mechanical lug and the second mechanical lug to an alternative electrical energy source.

15. The method of claim 14, wherein the assembly further comprises a front panel configured to provide a dead-front to the electrical distribution panel.

16. The method of claim 14, wherein the assembly further comprises a port configured to connect electrical wires to the first mechanical lug or the second mechanical lug.

17. The method of claim 14, further comprising a base that mechanically connects to a panel mechanical connector in the electrical distribution panel, and wherein the panel mechanical connector is configured to attach the circuit breaker to the electrical distribution panel.

18. An electrical distribution panel comprising, for a phase of the electrical distribution panel:
  a utility-side electrical connector configured to be connected to a power meter conductor,
  a circuit breaker comprising a load-side electrical connector configured to be connected to a load-side electrical conductor of the electrical distribution panel,
  a cover configured to prevent contact by a user with the electrical distribution panel,
  a first mechanical lug electrically connected to the utility-side electrical connector, and
  a second mechanical lug electrically connected to the load-side electrical conductor,
  wherein the first mechanical lug and the circuit breaker are electrically isolated.

19. The electrical distribution panel of claim 18, further comprising a cover that is configured to provide a dead-front to the electrical distribution panel.

20. The electrical distribution panel of claim 18, further comprising a housing, wherein the utility-side electrical connector and the load-side electrical connector are disposed within the housing.

* * * * *